(12) United States Patent
Choi

(10) Patent No.: US 11,557,600 B2
(45) Date of Patent: Jan. 17, 2023

(54) SEMICONDUCTOR DEVICE AND MANUFACTURING METHOD THEREOF

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 172 days.

(21) Appl. No.: 16/831,456

(22) Filed: Mar. 26, 2020

(65) Prior Publication Data

US 2020/0227437 A1 Jul. 16, 2020

Related U.S. Application Data

(63) Continuation of application No. 16/011,975, filed on Jun. 19, 2018, now Pat. No. 10,644,022.

(30) Foreign Application Priority Data

Oct. 12, 2017 (KR) .......................... 10-2017-0132684

(51) Int. Cl.
| | |
|---|---|
| *H01L 21/8238* | (2006.01) |
| *H01L 27/11582* | (2017.01) |
| *H01L 21/768* | (2006.01) |
| *H01L 23/532* | (2006.01) |
| *H01L 27/11565* | (2017.01) |
| *H01L 29/423* | (2006.01) |

(Continued)

(52) U.S. Cl.
CPC .. *H01L 27/11582* (2013.01); *H01L 21/76829* (2013.01); *H01L 23/53295* (2013.01); *H01L 27/1157* (2013.01); *H01L 27/11565* (2013.01); *H01L 27/11573* (2013.01); *H01L 27/11575* (2013.01); *H01L 29/4234* (2013.01)

(58) Field of Classification Search
CPC ..................... H01L 21/76829; H01L 27/11582
See application file for complete search history.

(56) References Cited

U.S. PATENT DOCUMENTS

| | | | |
|---|---|---|---|
| 9,437,606 | B2 | 9/2016 | Makala et al. |
| 9,627,405 | B1 | 4/2017 | Lee |

(Continued)

FOREIGN PATENT DOCUMENTS

| | | | |
|---|---|---|---|
| CN | 104520992 | A | 4/2015 |
| CN | 106486486 | A | 3/2017 |

(Continued)

*Primary Examiner* — Samuel A Gebremariam
(74) *Attorney, Agent, or Firm* — William Park & Associates Ltd.

(57) ABSTRACT

A semiconductor device and a method of manufacturing a semiconductor device pertain to a semiconductor device having a channel pattern, wherein the channel pattern includes a pipe channel and vertical channels protruding in a first direction from the pipe channel. The semiconductor device also has interlayer insulating layers disposed over the pipe channel and gate electrodes disposed over the pipe channel, wherein the gate electrodes are alternately stacked with the interlayer insulating layers in the first direction, wherein the stacked interlayer insulating layers and gate electrodes surround the vertical channels, and wherein the gate electrodes include a first conductive pattern and second conductive patterns. The semiconductor device further has an etch stop pattern disposed over the first conductive pattern and under the second conductive patterns.

11 Claims, 31 Drawing Sheets

(51) Int. Cl.
*H01L 27/11573* (2017.01)
*H01L 27/11575* (2017.01)
*H01L 27/1157* (2017.01)

(56) References Cited

U.S. PATENT DOCUMENTS

| | | |
|---|---|---|
| 2012/0068255 A1 | 3/2012 | Lee et al. |
| 2012/0168858 A1 | 7/2012 | Hong |
| 2012/0205722 A1 | 8/2012 | Lee et al. |
| 2013/0009229 A1* | 1/2013 | Lee ............... H01L 27/11556 |
| | | 257/E27.06 |
| 2014/0042520 A1 | 2/2014 | Lee et al. |
| 2014/0264542 A1 | 9/2014 | Simsek-Ege et al. |
| 2017/0162592 A1 | 6/2017 | Nishikawa et al. |
| 2017/0162594 A1 | 6/2017 | Ahn |
| 2017/0207226 A1 | 7/2017 | Lee |
| 2017/0338241 A1 | 11/2017 | Lee |
| 2017/0358356 A1 | 12/2017 | Lee |
| 2018/0151590 A1 | 5/2018 | Lee et al. |
| 2019/0043830 A1 | 2/2019 | Sakakibara et al. |
| 2019/0115362 A1 | 4/2019 | Choi |

FOREIGN PATENT DOCUMENTS

| | | |
|---|---|---|
| CN | 106537591 A | 3/2017 |
| CN | 106601752 A | 4/2017 |
| CN | 106856198 A | 6/2017 |
| CN | 106992184 A | 7/2017 |
| KR | 1020120094338 A | 8/2012 |
| KR | 1020140076797 A | 6/2014 |
| KR | 1020170023654 A | 3/2017 |
| KR | 1020190041287 A | 4/2019 |

* cited by examiner

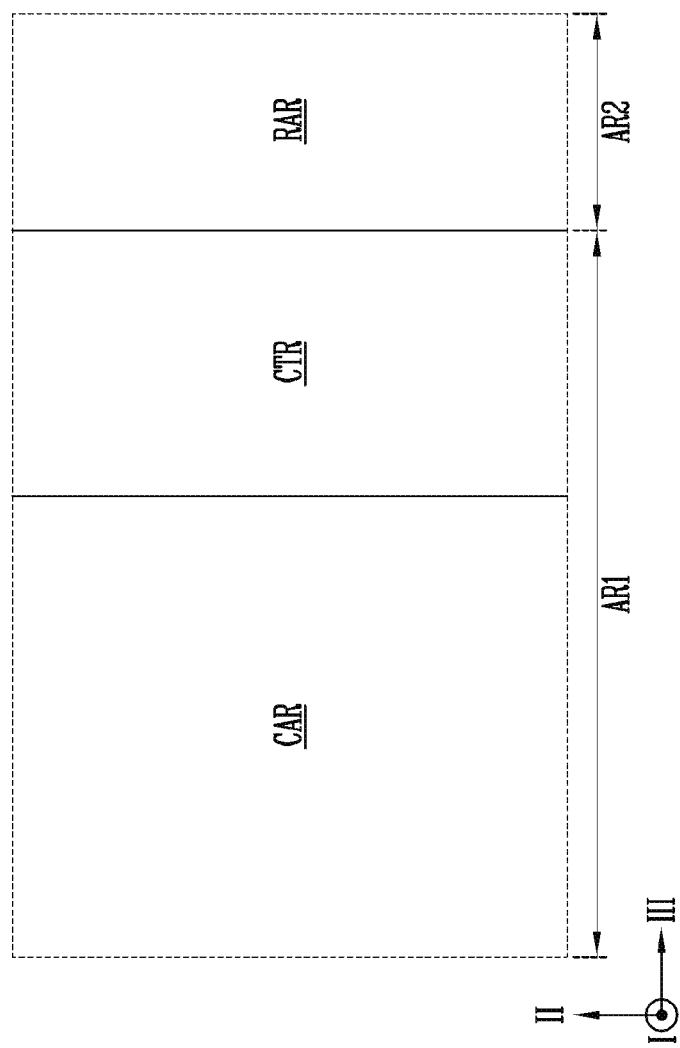

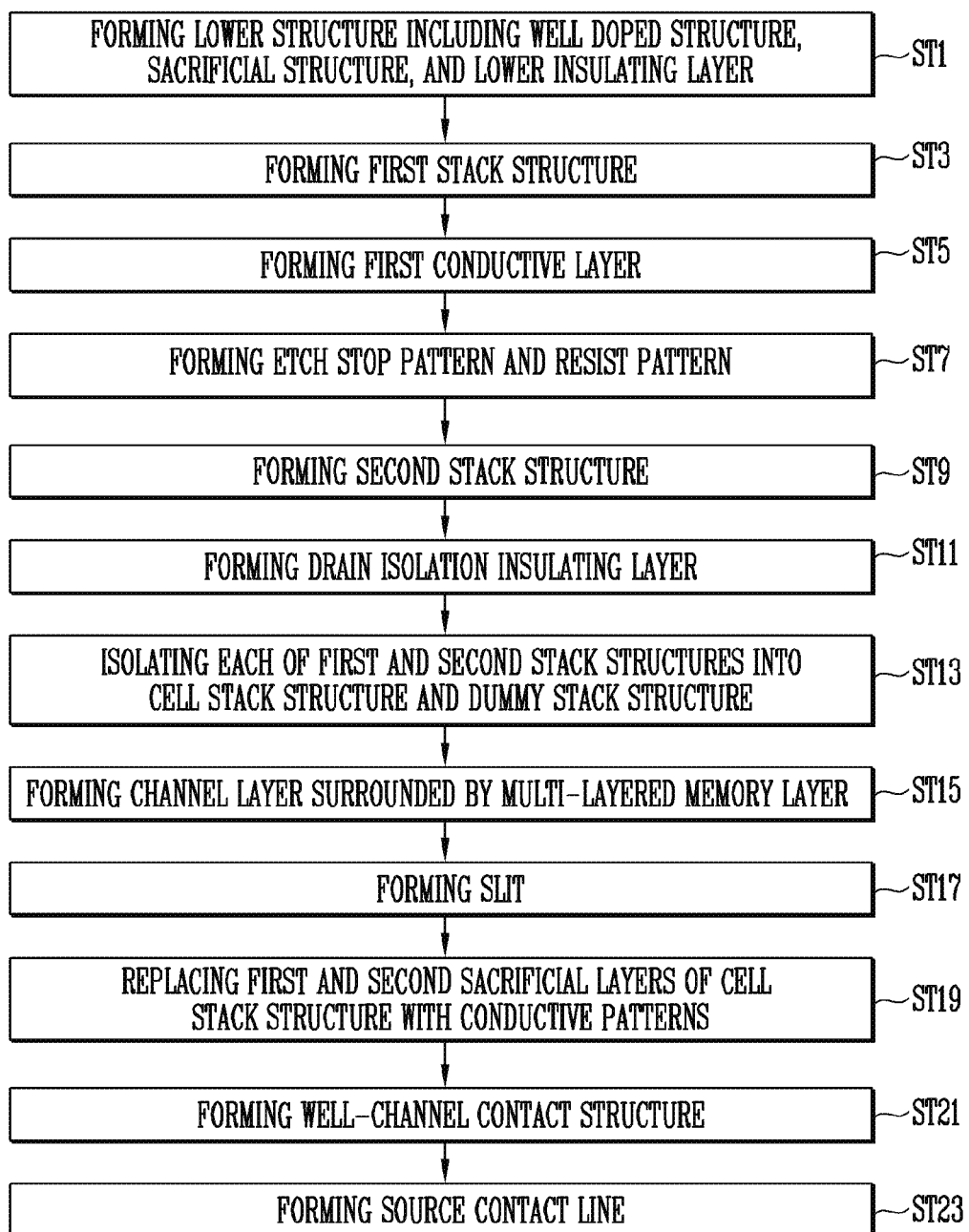

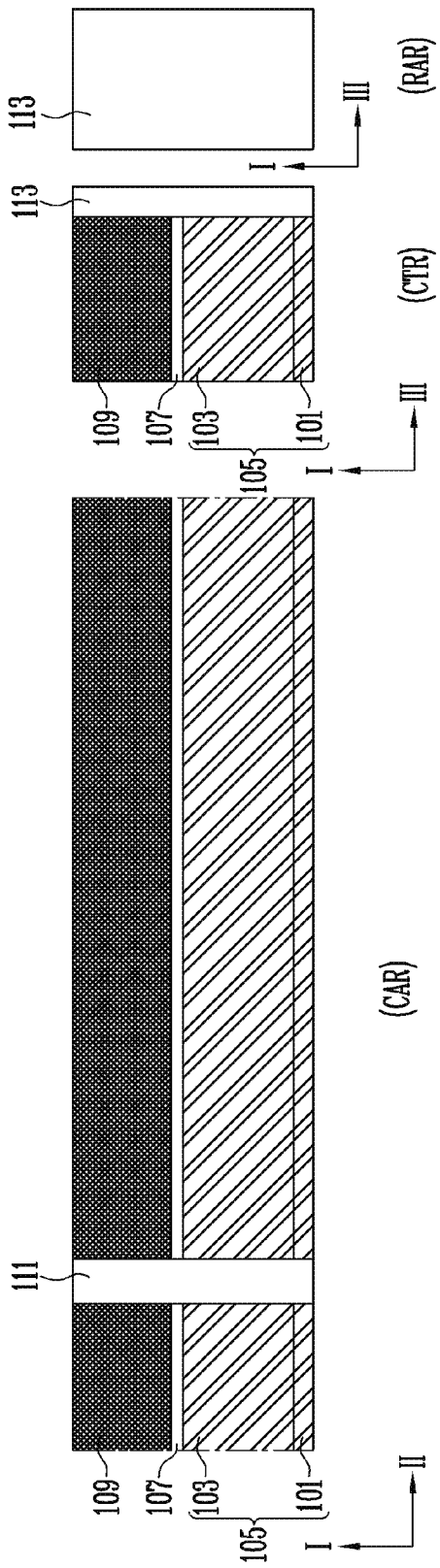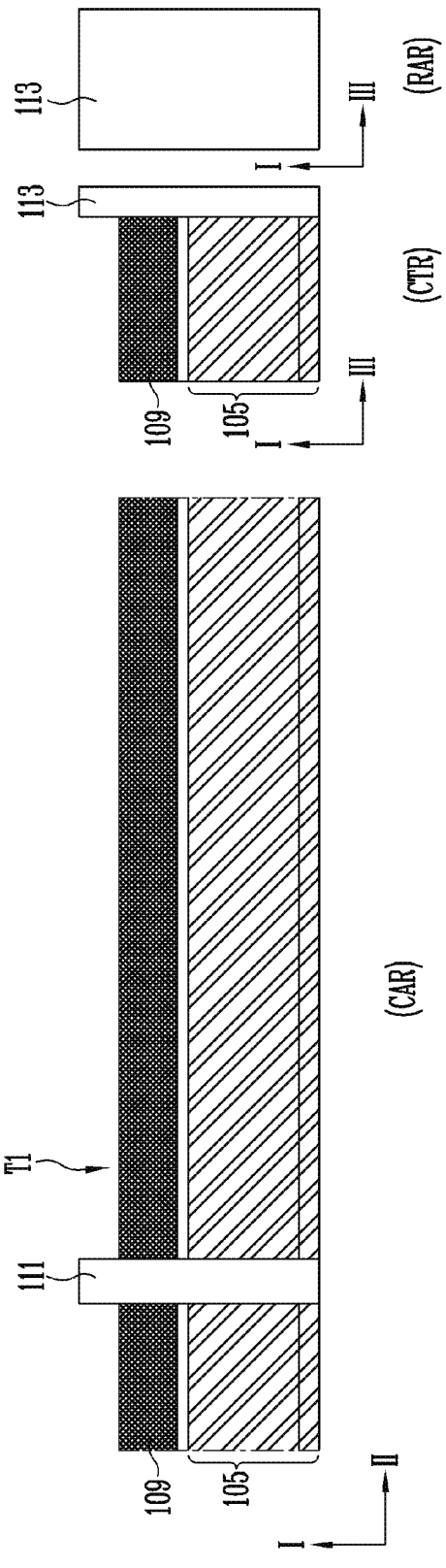

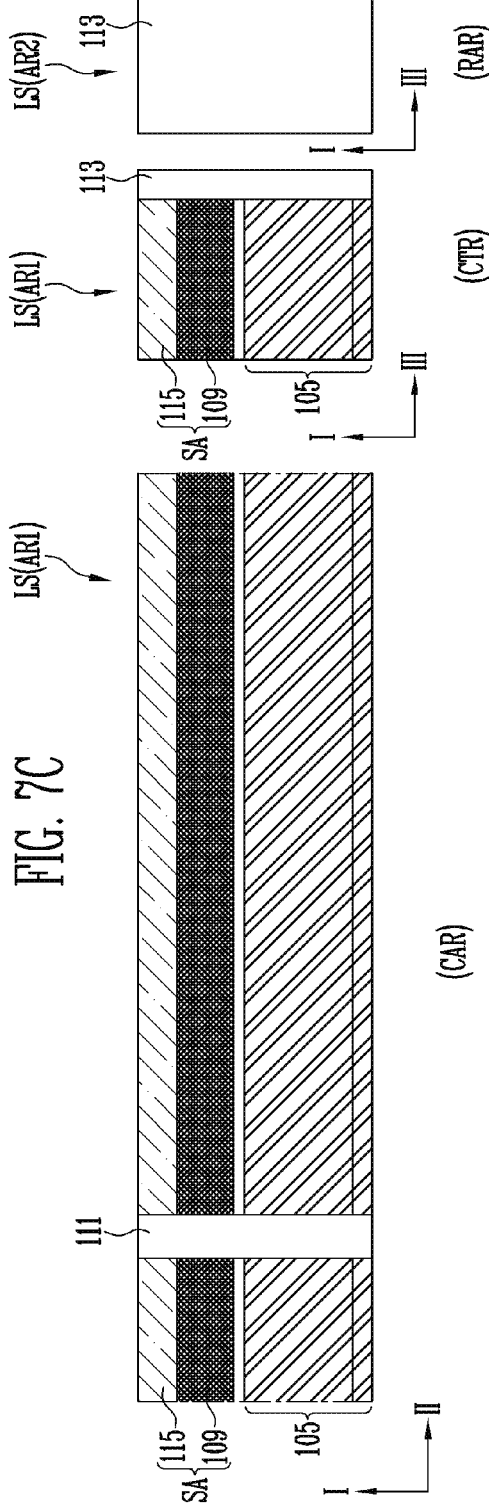
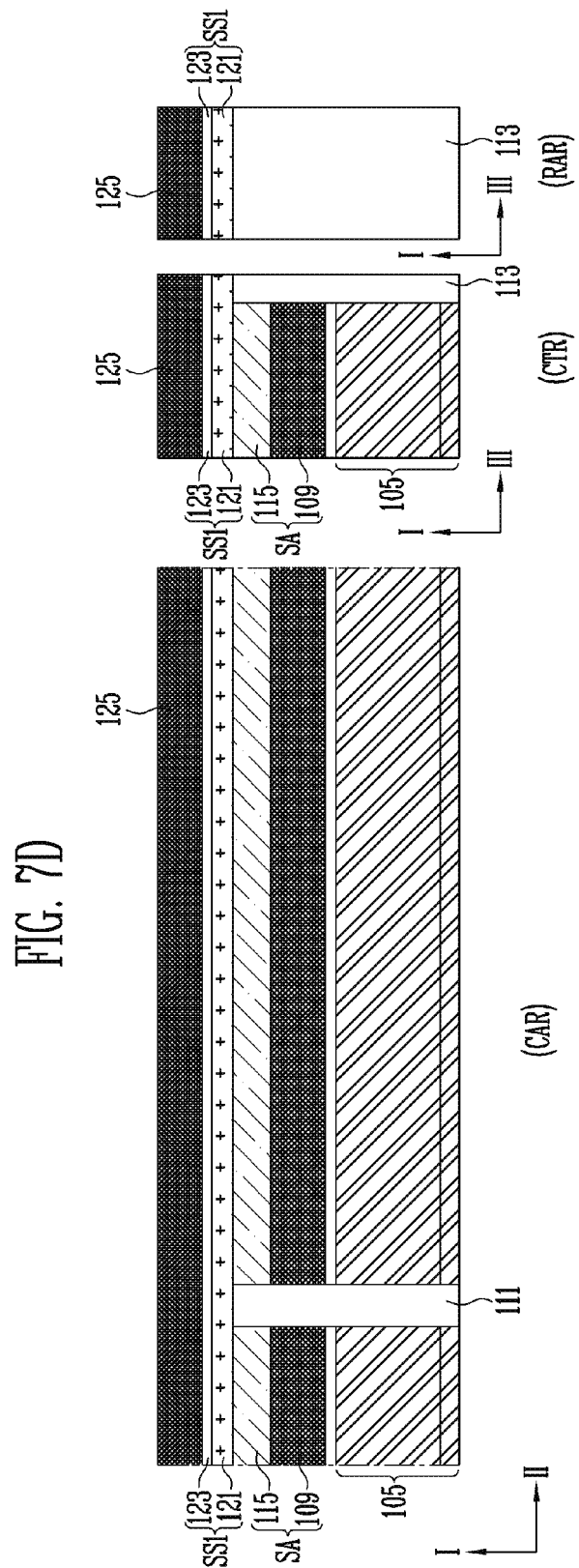
FIG. 7C
FIG. 7D

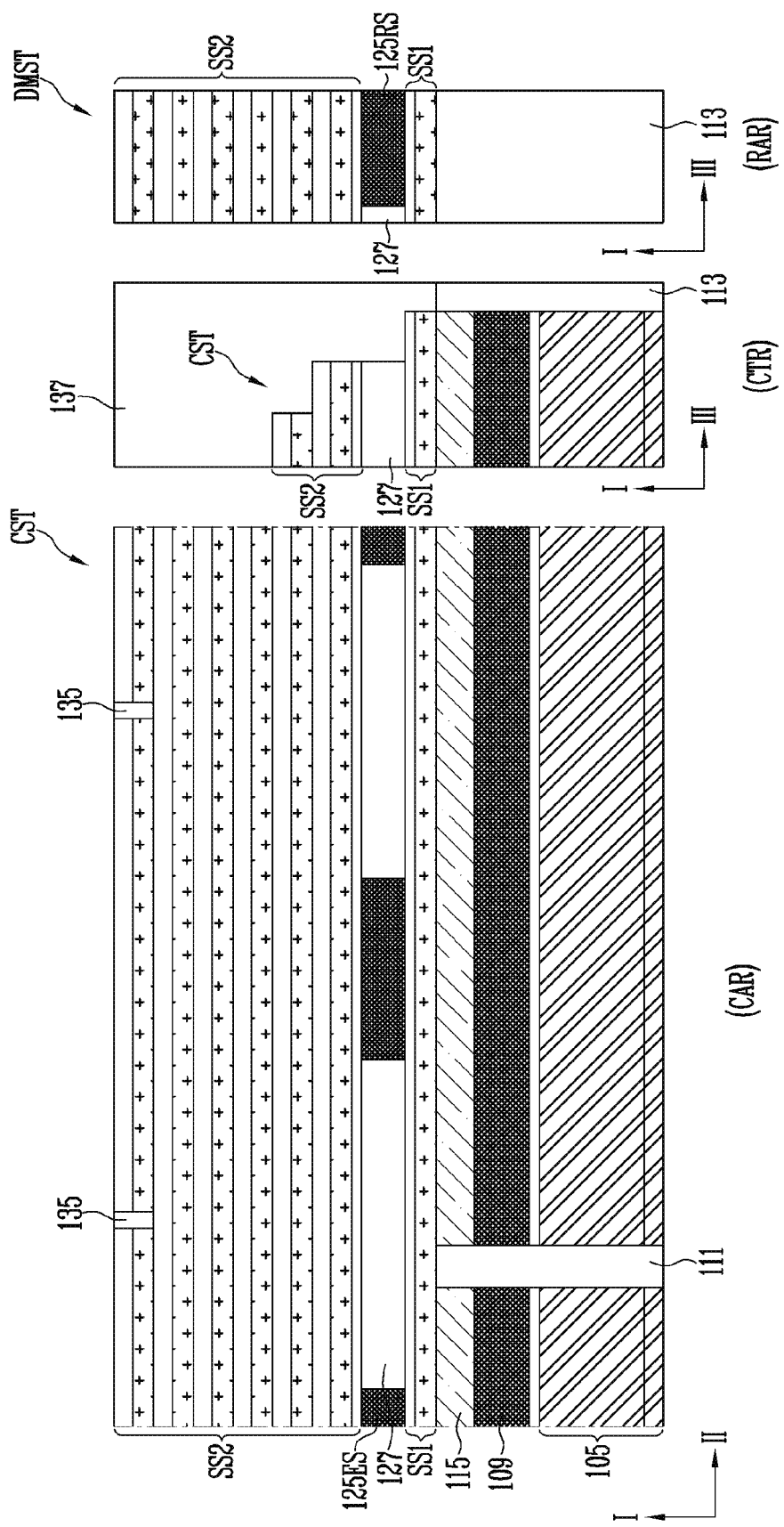

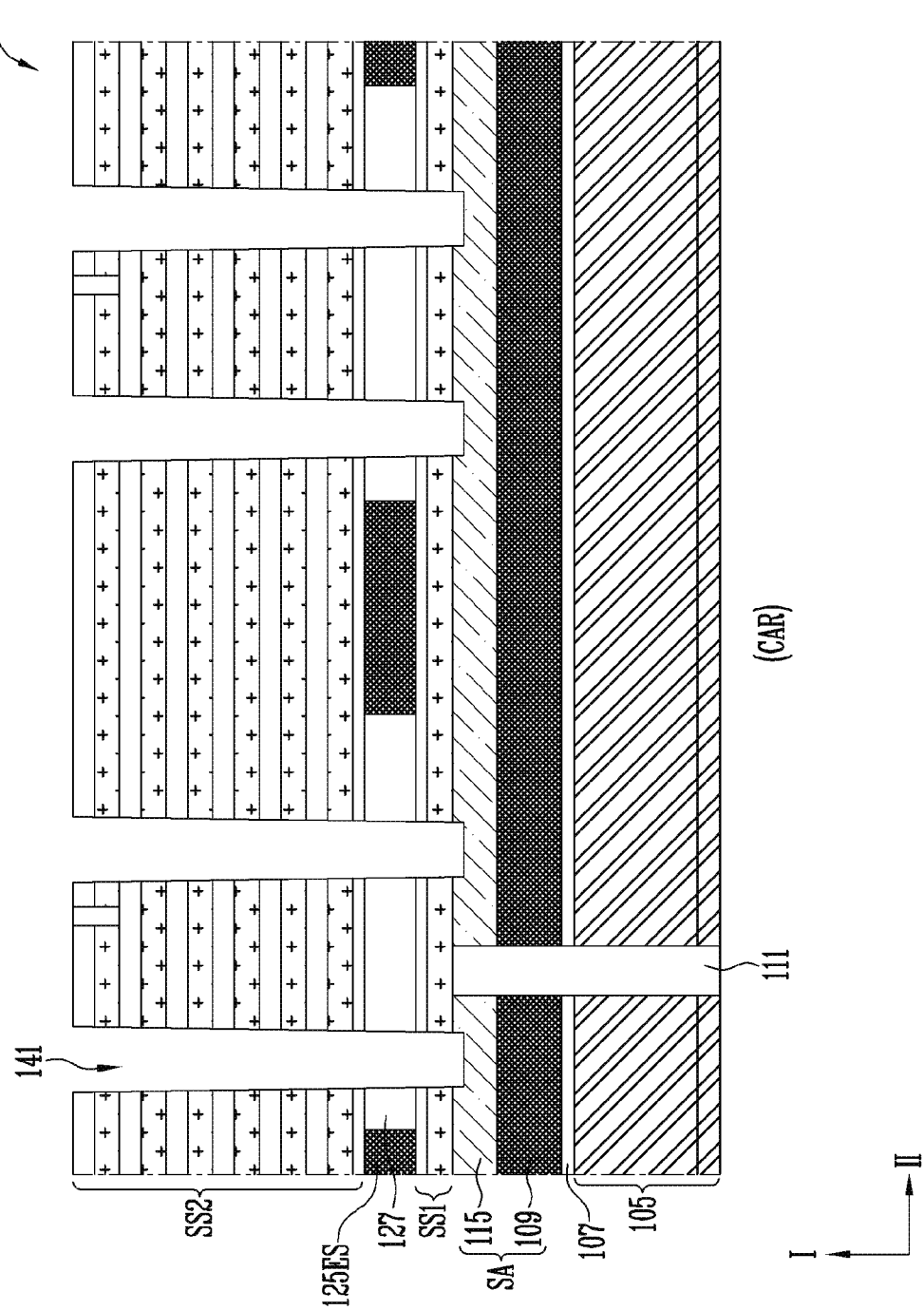

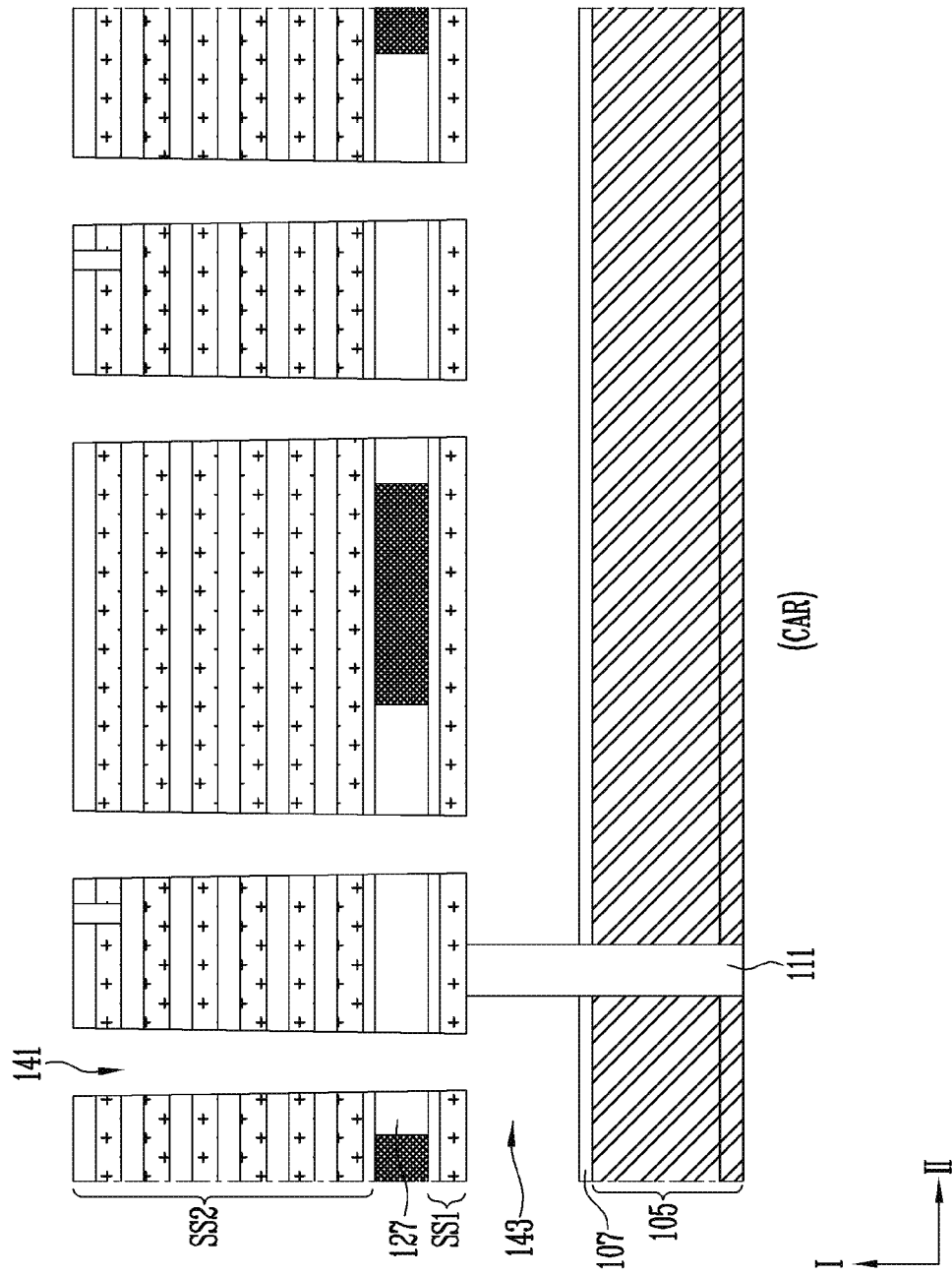

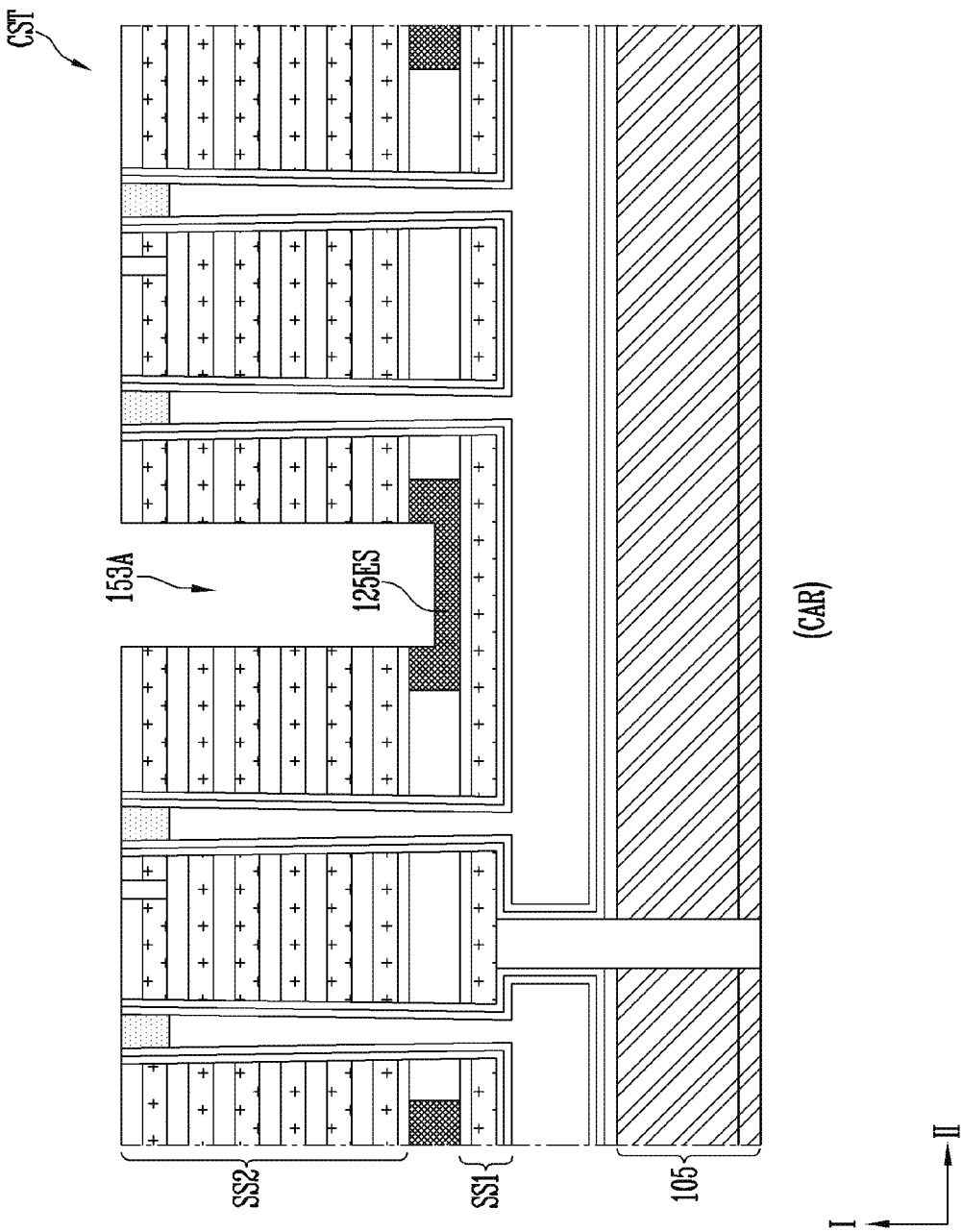

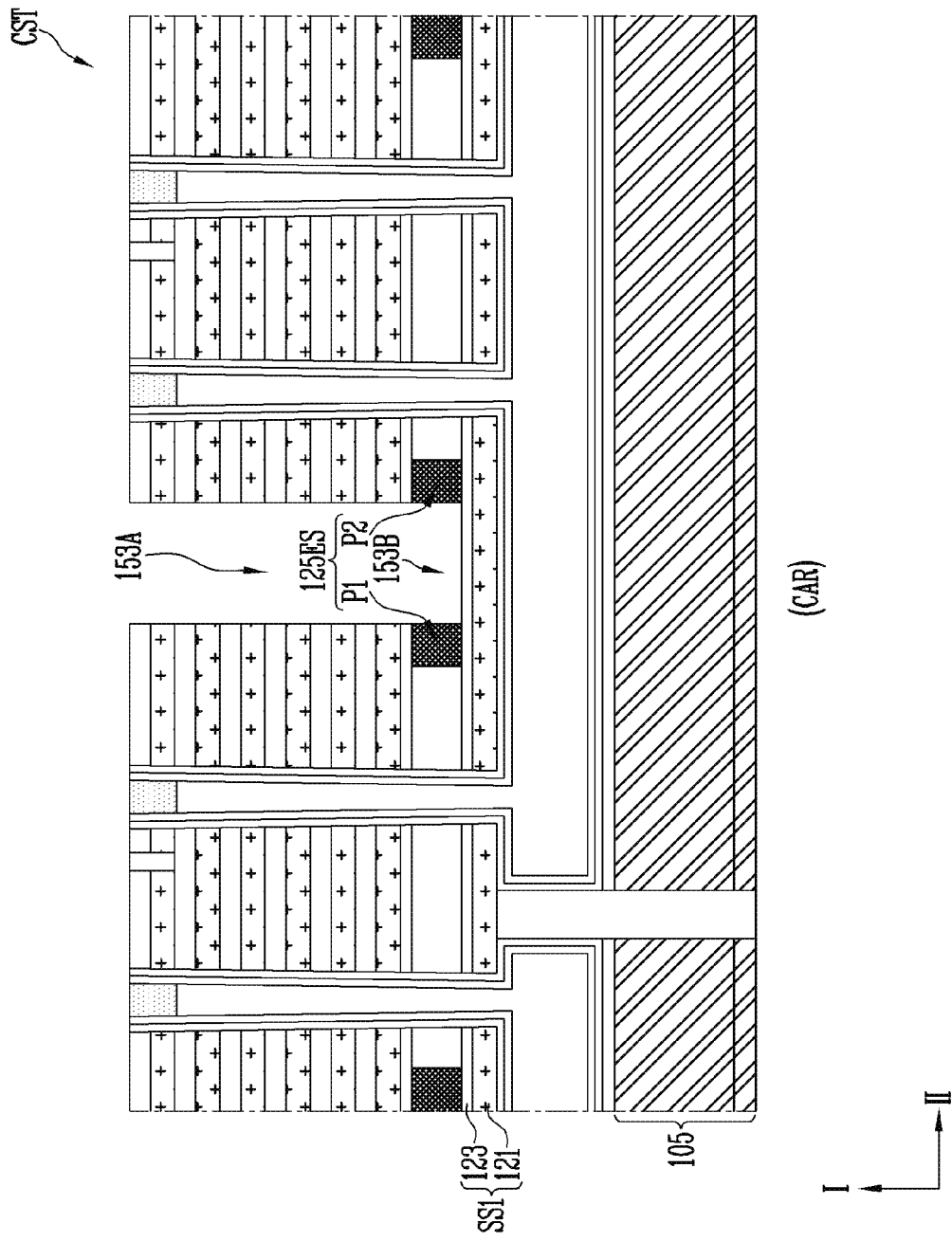

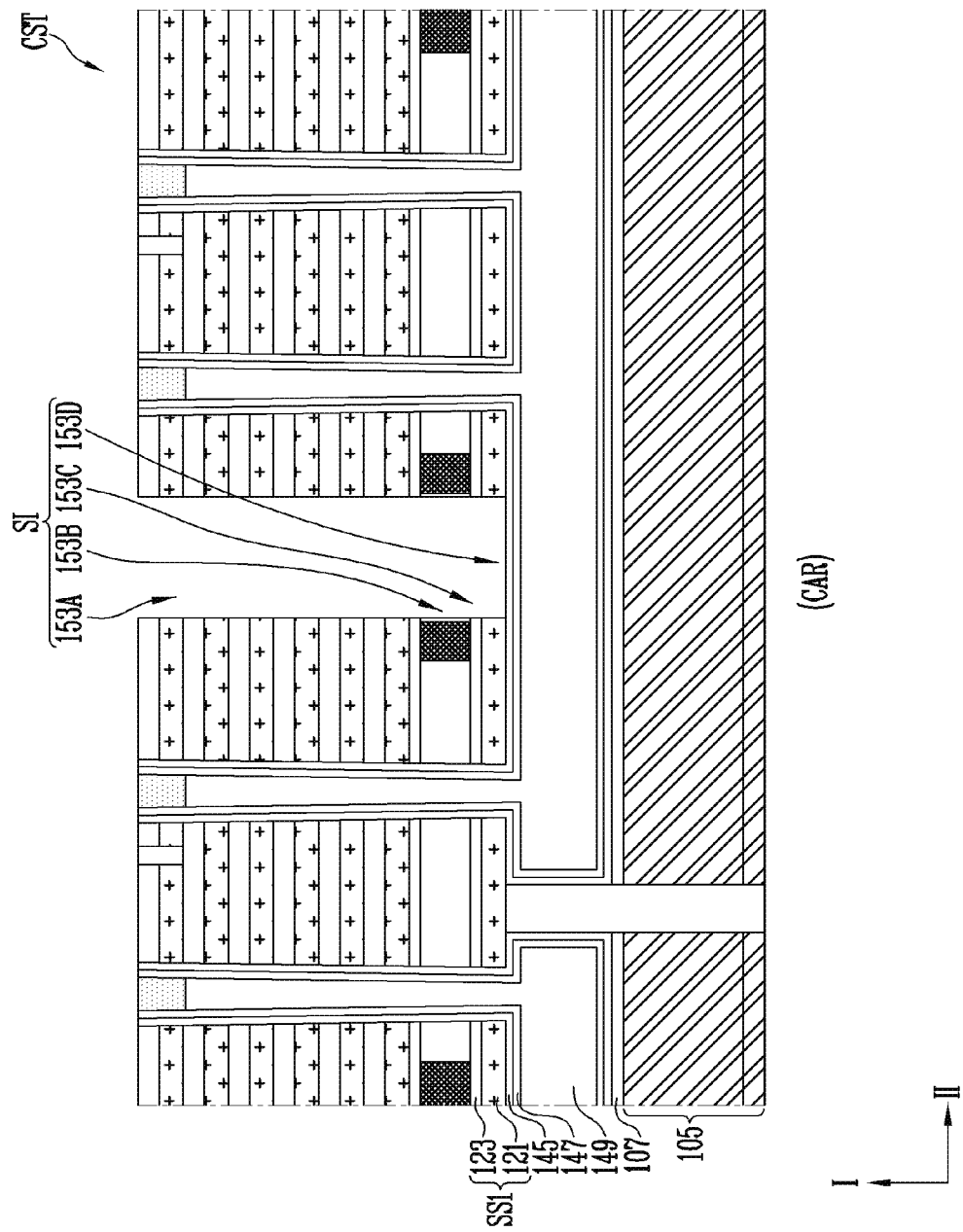

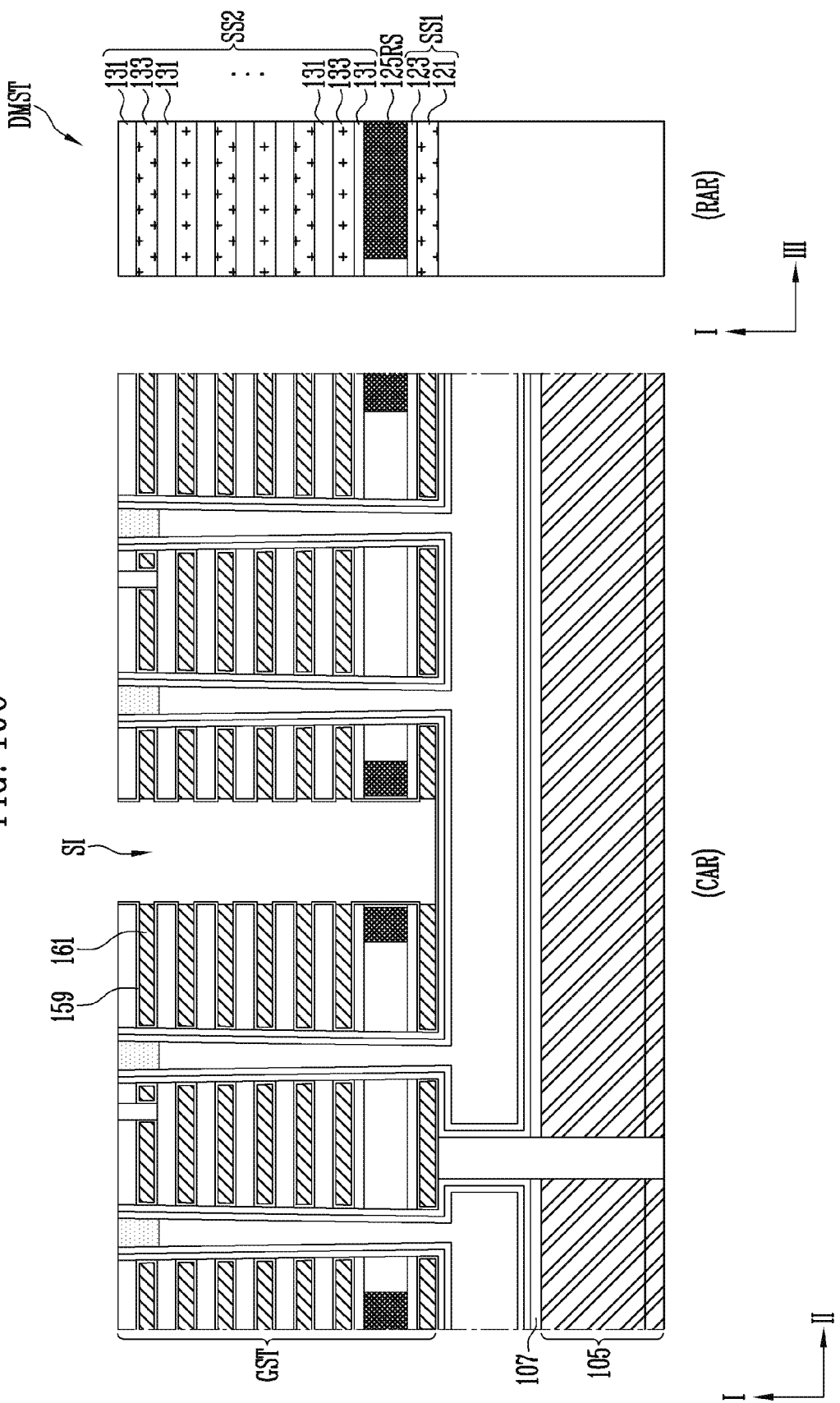

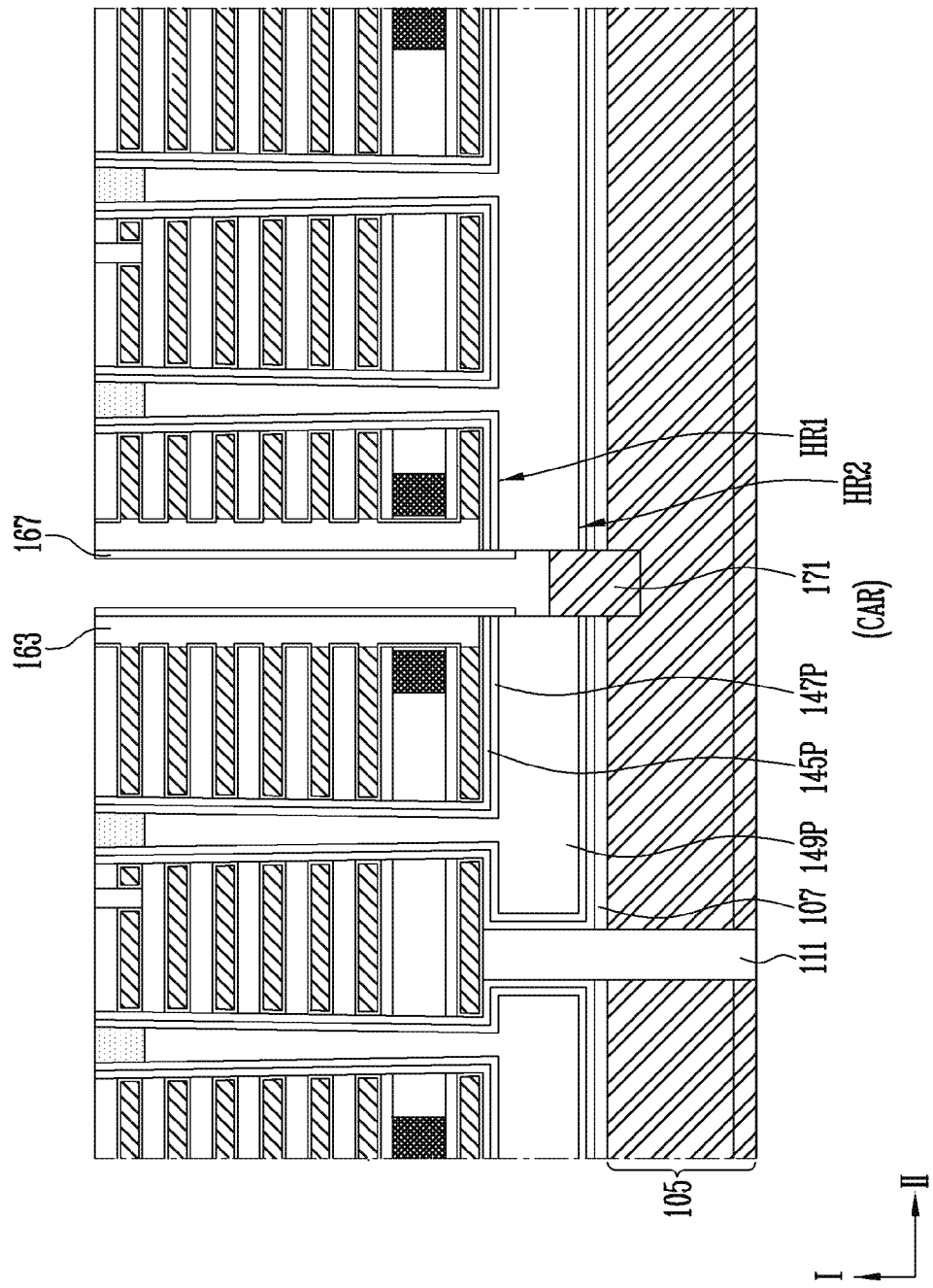

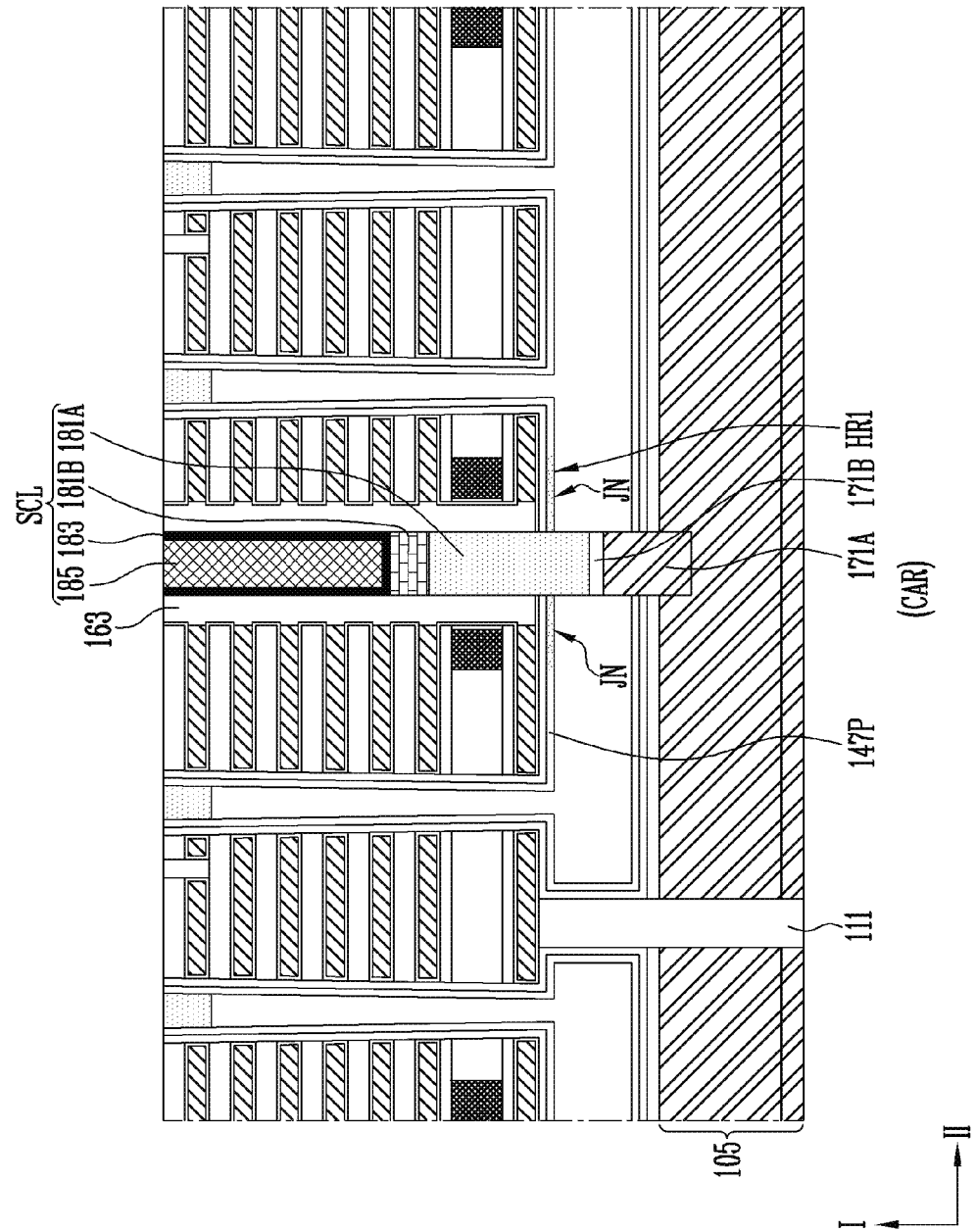

SEMICONDUCTOR DEVICE AND MANUFACTURING METHOD THEREOF

CROSS-REFERENCE TO RELATED APPLICATION

The present application is a continuation application of U.S. patent application Ser. No. 16/011,975, filed on Jun. 19, 2018, and claims priority under 35 U.S.C. § 119(a) to Korean patent application number 10-2017-0132684, filed on Oct. 12, 2017, in the Korean Intellectual Property Office, the entire disclosure of which is incorporated herein by reference.

BACKGROUND

1. Technical Field

An aspect of the present disclosure may generally relate to a semiconductor device and a manufacturing method thereof, and more particularly, to a three-dimensional semiconductor device and a manufacturing method thereof.

2. Related Art

Semiconductor devices may include a plurality of memory cell transistors, which are capable of storing data. The memory cell transistors can be connected in series between select transistors and may be used to constitute a memory string. Three-dimensional semiconductor devices achieve a high degree of integration. However, manufacturing three-dimensional semiconductor devices can involve additional complications over manufacturing two-dimensional semiconductor devices.

SUMMARY

In accordance with the teachings of the present disclosure is a semiconductor device having a channel pattern, wherein the channel pattern includes a pipe channel and vertical channels protruding in a first direction from the pipe channel. The semiconductor device also has interlayer insulating layers disposed over the pipe channel and gate electrodes disposed over the pipe channel, wherein the gate electrodes are alternately stacked with the interlayer insulating layers in the first direction, wherein the stacked interlayer insulating layers and gate electrodes surround the vertical channels, and wherein the gate electrodes include a first conductive pattern and second conductive patterns. The semiconductor device further has an etch stop pattern disposed over the first conductive pattern and under the second conductive patterns.

Also in accordance with the teachings of the present disclosure is a method of manufacturing a semiconductor device. The method includes forming a first stack structure in which a first sacrificial layer and a first interlayer insulating layer are stacked. The method also includes forming an etch stop pattern on the first stack structure. The method further includes forming a second stack structure on the etch stop pattern. The second stack structure may include second interlayer insulating layers and second sacrificial layers are alternately stacked. The method additionally includes forming a channel layer penetrating the first stack structure from the second stack structure, wherein the channel layer extends along a lower surface of the first stack structure, and wherein the channel layer is surrounded by a multi-layered memory layer. The method also includes forming a slit penetrating the first stack structure from the second stack structure and replacing the first and second sacrificial layers with conductive patterns through the slit.

Further in accordance with the teaching of the present disclosure is a method of manufacturing a semiconductor device, which includes forming a first stack structure in which a first sacrificial layer and a first interlayer insulating layer are stacked. The method also includes forming an etch stop pattern on the first stack structure forming a second stack structure on the etch stop pattern, wherein the second stack structure includes second interlayer insulating layers and second sacrificial layers alternately stacked. The method further includes forming a channel layer penetrating the first stack structure from the second stack structure, wherein the channel layer extends along a lower surface of the first stack structure. The method additionally includes forming a slit by etching through the second stack structure to the etch stop pattern to expose the second sacrificial layers.

BRIEF DESCRIPTION OF THE DRAWINGS

FIG. 1 shows a plan view illustrating various regions of a semiconductor device according to an embodiment of the present disclosure.

FIG. 6 shows a flowchart schematically illustrating a manufacturing method of a semiconductor device according to an embodiment of the present disclosure.

FIGS. 7A to 7G, FIGS. 8A to 8D, FIGS. 9A to 9D, FIGS. 10A to 10C and FIGS. 11A to 11F show sectional views illustrating a manufacturing method of a semiconductor device according to an embodiment of the present disclosure.

DETAILED DESCRIPTION

Figure 2A:
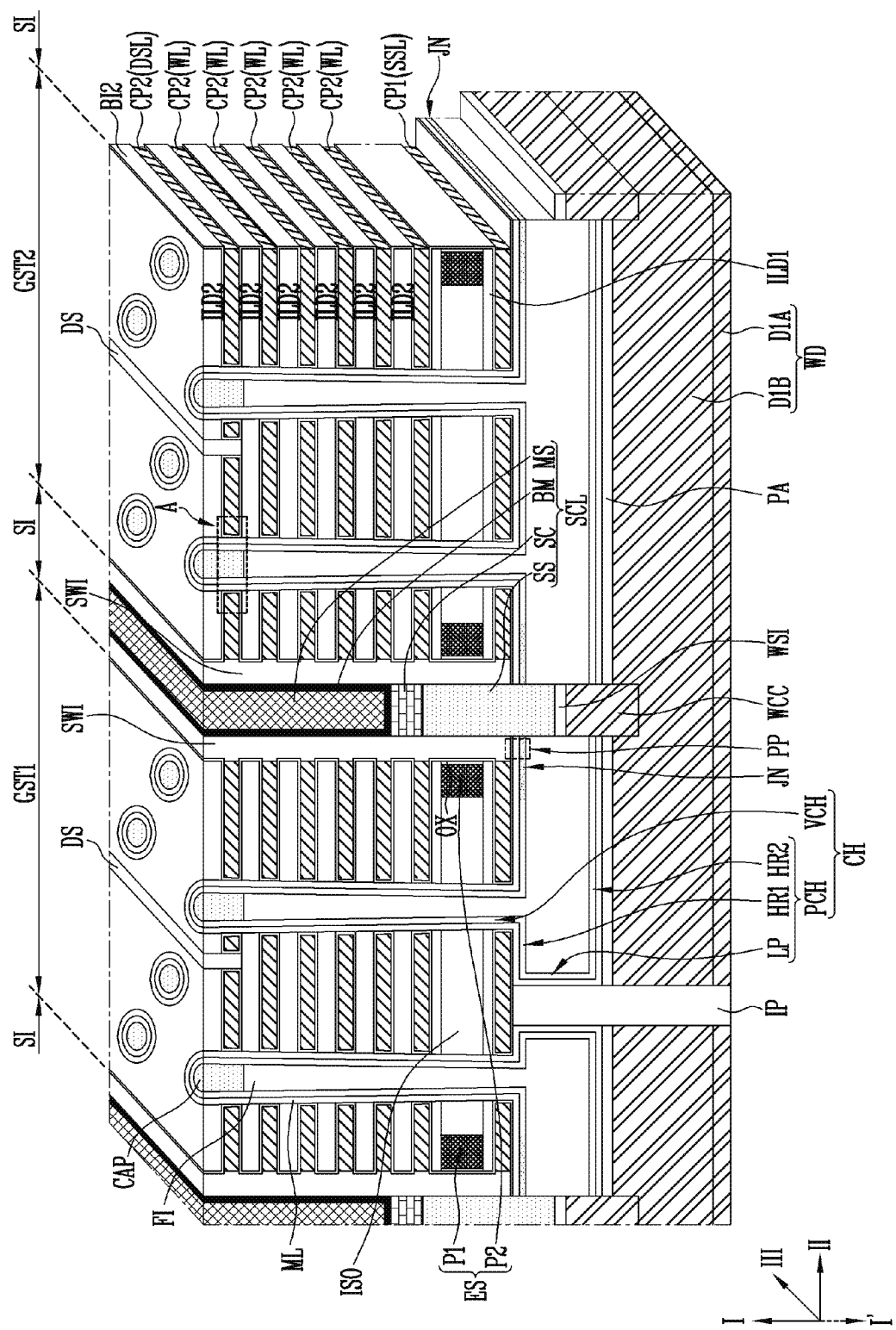
FIGS. 2A and 2B show perspective views illustrating semiconductor devices according to embodiments of the present disclosure.

Example embodiments of the present disclosure are described with reference to the accompanying drawings. The example embodiments, however, may be embodied in many different forms and should not be construed as being limited to the examples of embodiments set forth herein. Rather, the example embodiments are provided so that the present teachings are clear and enabling for those skilled in the art. The features of the present teachings may be employed in various and numerous embodiments, not all of which are presented, without departing from the scope of the present disclosure.

In the drawing figures, relative dimensions may be exaggerated for clarity of illustration. It will be understood that when an element is referred to as being "between" two elements, it can be the only element between the two elements, or one or more intervening elements may also be present. Like reference numerals refer to like elements throughout.

It is also noted that, "on" refers to one component not only directly on another component but also indirectly on another component through an intermediate component or intermediate components. On the other hand, 'directly on' refers to one component directly on another component without an intermediate component.

Embodiments may provide a semiconductor device and a manufacturing method thereof, which can lower the level of difficulty of manufacturing processes of a three-dimensional semiconductor device.

In an embodiment in accordance with the present teachings, for example, a method of manufacturing a semiconductor device includes forming a first stack structure in which a first sacrificial layer and a first interlayer insulating layer are stacked. The method also includes forming an etch stop pattern on the first stack structure forming a second stack structure on the etch stop pattern, wherein the second stack structure includes second interlayer insulating layers and second sacrificial layers alternately stacked. The method further includes forming a channel layer penetrating the first stack structure from the second stack structure, wherein the channel layer extends along a lower surface of the first stack structure. The method additionally includes forming a slit by etching through the second stack structure to the etch stop pattern to expose the second sacrificial layers.

For an embodiment, the manufacturing method of the semiconductor device further includes deepening the slit by etching through the etch stop pattern to the first interlayer insulating layer. A further embodiment includes deepening the slit by etching through the first interlayer insulating layer to the first sacrificial layer. A further embodiment includes deepening the slit by etching through the first sacrificial layer to a multi-layered memory layer, wherein the multi-layered memory layer surrounds the channel layer. A further embodiment includes replacing the first and second sacrificial layers with conductive patterns through the slit.

FIG. 1 shows a plan view illustrating various regions of a semiconductor device according to an embodiment of the present disclosure.

Referring to FIG. 1, the semiconductor device may include a first region AR1 and a second region AR2, which are adjacent to each other. The first region AR1 may include a cell array region CAR and at least one contact region CTR. The contact region CTR may extend from the cell array region CAR, as shown. The second region AR2 may include at least one resistive element region RAR.

The first region AR1 is a region in which gate electrodes of memory cell transistors and select transistors are disposed. Each of the gate electrodes may extend toward the contact region CTR from the cell array region CAR. A structure of conductive patterns corresponding to the gate electrodes is described in detail below with reference to FIGS. 2A and 2B.

The cell array region CAR is a region in which vertical channels of a channel pattern are disposed. Each of the vertical channels may extend in a first direction I, and the vertical channels may be arranged in various layouts along second II and third III directions, shown to be perpendicular to the first direction I. The vertical channels are described in detail below with respect to FIGS. 2A and 2B.

The contact region CTR is a region in which end portions of the gate electrodes are disposed. Center portions of the gate electrodes extending from the end portions of the gate electrodes surround the vertical channels in the cell array region CAR. The end portions of the gate electrodes may form a staggered, tiered, or step structure. The step structure formed with the gate electrodes is described in detail below with reference to FIGS. 5A and 5B.

The second region AR2 is a region from which the gate electrodes are absent. Elements constituting peripheral circuits may be disposed in the second region AR2. For example, the second region AR2 may include the resistive element region RAR in which a resistive element is disposed. The semiconductor device uses a resistor to generate a bias of a desired level. The resistor is used in a circuit for applying an operating voltage or a circuit for controlling the operating voltage. For example, the resistor is used in a pump regulator circuit for voltage division. A resistor pattern is described in detail below with reference to FIGS. 5A and 5B.

Figure 2B:
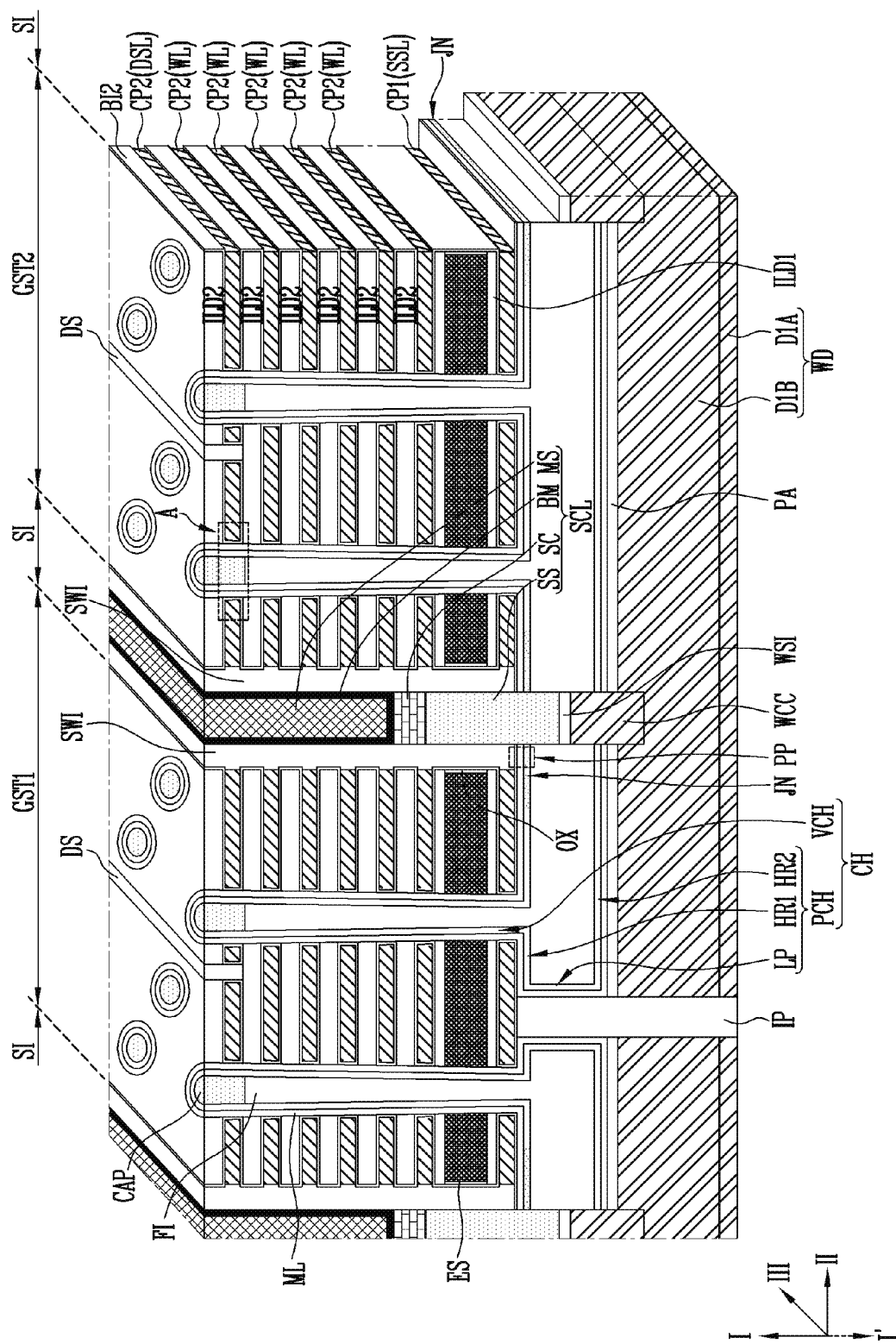

FIGS. 2A and 2B show perspective views illustrating semiconductor devices according to some embodiments of the present disclosure. In particular, FIGS. 2A and 2B show perspective views illustrating structures formed in the cell array region CAR shown in FIG. 1.

Referring to FIGS. 2A and 2B, the semiconductor device may include channel patterns CH, gate stack structures GST1 and GST2 surrounding the channel patterns CH, a well doped structure WD which is disposed under the gate stack structures GST1 and GST2 and includes a first conductivity type dopant, a well-channel contact structure WCC connecting the channel patterns CH to the well doped structure WD, and a source contact line SCL disposed between the gate stack structures GST1 and GST2 to be connected to the channel patterns CH.

Each of the channel patterns CH may be formed of a semiconductor layer. For example, each of the channel patterns CH may be formed of a silicon layer.

Each of the channel patterns CH may include a pipe channel PCH and vertical channels VCH protruding in a first direction I from the pipe channel PCH. The pipe channel PCH may include a first horizontal part HR1, a second horizontal part HR2, and a connection part LP.

The first horizontal part HR1 may be connected to the vertical channels VCH. The first horizontal part HR1 may be disposed on a plane extending in second II and third III directions, which the first direction is normal to for some embodiments. The first horizontal part HR1 may include a protrusion part PP protruding farther in the second direction II than both ends of each of the gate stack structures GST1 and GST2.

The connection part LP may extend in a I' direction, which is opposite to the direction in which the vertical channels VCH extend from the first horizontal part HR1. The connection part LP may extend along a sidewall of a supporting body IP. The supporting body IP supports a space between the well doped structure WD and the gate stack structures GST1 and GST2. The supporting body IP may extend to penetrate the well doped structure WD. The sidewall of the supporting body IP is surrounded by each of the well doped structure WD and the channel patterns CH. Hence, each of the well doped structure WD and the channel patterns CH is not isolated by the supporting body IP.

The second horizontal part HR2 extends from the connection part LP and is parallel to the first horizontal part HR1. The second horizontal part HR2 is formed to overlap with the vertical channels VCH. The second horizontal part HR2 is spaced apart from the first horizontal part HR1.

An outer wall of each of the channel patterns CH may be surrounded by a multi-layered memory pattern ML. More specifically, the multi-layered memory pattern ML extends along interfaces between the channel patterns CH and the gate stack structures GST1 and GST2, an interface between the channel patterns CH and the supporting body IP, and an interface between the channel patterns CH and the well doped structure WD. Material layers constituting the multi-layered memory pattern ML are described below with reference to FIG. 3.

Each of the channel patterns CH may be formed on a surface of a gap-fill insulating pattern FI. That is, the gap-fill insulating pattern FI is surrounded by the channel pattern CH. More specifically, the gap-fill insulating pattern FI fills in a horizontal space defined by the first horizontal part HR1, the second horizontal part HR2, and the connection part LP. The gap-fill insulating pattern FI may extend in the first direction I to penetrate any one of the gate stack structures GST1 and GST2. A portion of the gap-fill insulating pattern FI penetrating each of the gate stack structures GST1 and GST2 is surrounded by the vertical channel VCH. The gap-fill insulating pattern FI may be formed to have a height lower than that of the vertical channel VCH. In this case, a capping pattern CAP may be formed on the gap-fill insulating pattern FI. The capping pattern CAP is surrounded by the vertical channel VCH.

The capping pattern CAP may be in direct contact with the vertical channel VCH. The capping pattern CAP may be formed of a doped semiconductor layer including a second conductivity type dopant. The first conductivity type and the second conductivity type are opposite to each other. The second conductivity type dopant may be an n type. More specifically, the capping pattern CAP may be an n-type doped silicon layer. The capping pattern CAP may be used as a drain junction.

The gate stack structures GST1 and GST2 are disposed between the well doped structure WD and bit lines (not shown). In FIGS. 2A and 2B, illustration of the bit lines is omitted for convenience of description, but the bit lines may be disposed above the gate stack structures GST1 and GST2 to be respectively connected to the vertical channels VCH corresponding thereto. A connection structure disposed between the bit lines and the vertical channels VCH may be variously designed. Two gate stack structures GST1 and GST2 are illustrated in FIGS. 2A and 2B, but the semiconductor device according to some embodiments of the present disclosure may include a plurality of gate stack structures isolated by slits SI. In each of the slits SI disposes a sidewall insulating layer SWI and the source contact line SCL.

The gate stack structures GST1 and GST2 are disposed on the pipe channels PCH of the channel patterns CH, as shown. Each of the gate stack structures GST1 and GST2 may include interlayer insulating layers ILD1 and ILD2 and gate electrodes CP1 and CP2, which are alternately stacked along the first direction I, and at least one etch stop pattern ES.

The etch stop pattern ES may be disposed between gate electrodes adjacent to each other in the first direction I. For example, the gate electrodes CP1 and CP2 may be divided into a first conductive pattern CP1 disposed under the etch stop pattern ES and second conductive patterns CP2 stacked on the etch stop pattern ES to be spaced apart from each other in the first direction I. The etch stop pattern ES is disposed between the first conductive pattern CP1 and the second conductive pattern CP2, which are adjacent to each other.

The first conductive pattern CP1 is a pattern disposed closest to the pipe channel PCH among the gate electrodes CP1 and CP2. The first conductive pattern CP1 may be used as a source select line SSL. The second conductive patterns CP2 may be used as word lines WL and a drain select line DSL, as indicated. The drain select line DSL is disposed above the word lines WL. The word lines WL may be disposed between the drain select line DSL and the etch stop pattern ES. The etch stop pattern ES may be disposed between the source select line SSL and the word lines WL. At least one of the second conductive patterns CP2 from the uppermost layer may be penetrated by a drain isolation insulating layer DS. The drain isolation insulating layer DS extends along the third direction III. The drain select line DSL may be defined between the drain isolation insulating layer DS and the slit SI. The drain isolation insulating layer DS may be formed to have a depth insufficient to penetrate the word lines WL and the source select line SSL. According to the above-described structure, a number of vertical channels VCH controlled by the drain select line DSL may be less than a number of vertical channels VCH controlled by each word line WL or each source select line SSL. More specifically, the vertical channels VCH penetrating each of the gate stack structures GST1 and GST2 may be divided into a first group and a second group with the drain isolation insulating layer DS interposed therebetween. The first group and the second group may be controlled by the same word lines WL or the same source select line SSL. The first group and the second group may be controlled by different drain select lines DSL.

The interlayer insulating layers ILD1 and ILD2 may be formed of an insulating material such as an oxide layer. The interlayer insulating layers ILD1 and ILD2 may be divided into first and second interlayer insulating layers. The first interlayer insulating layer ILD1 is disposed between the first conductive pattern CP1 and the etch stop pattern ES, which are adjacent to each other in the first direction I, and the second interlayer insulating layers ILD2 are disposed over the etch stop pattern ES. The second interlayer insulating layers ILD2 are spaced apart from each other in the first direction I and disposed on the top and bottom of each of the stacked second conductive patterns CP2. According to the above-described structure, the second conductive patterns CP2 and the second interlayer insulating layers ILD2 are alternately stacked one by one in the first direction I.

The first conductive pattern CP1 and the second conductive patterns CP2 are formed of the same conductive material. The etch stop pattern ES may be formed of a conductive material different from that of the first conductive pattern CP1 and the second conductive patterns CP2, which are the gate electrodes. The etch stop pattern ES may be formed of a material layer capable of serving as an etch stop layer by considering a process of forming the slit SI. The etch stop pattern ES may be formed of a material having an etching rate different from that of the interlayer insulating layers ILD1 and ILD2. In order to realize simplification of a process, the etch stop pattern ES may be formed of a conductive layer that can be used as a resistor pattern. The resistor pattern is a conductive pattern disposed in a resistive element region. The resistor pattern is described in detail below with reference to FIGS. 4A and 4B.

As described above, the etch stop pattern ES may be formed of a material selected from conductive materials that can be used as resistor patterns and serve as etch stop layers. For example, the etch stop pattern ES may be formed of a poly-silicon layer. The poly-silicon layer may include a dopant. For example, the poly-silicon layer may include an n-type dopant.

The etch stop pattern ES is formed sufficiently thick to serve as an etch stop layer in an etching process for forming the slit SI. More specifically, the etch stop pattern ES may be formed thicker in the first direction I than each of the first conductive pattern CP1 and the second conductive patterns CP2.

The first and second conductive patterns CP1 and CP2 are formed of a conductive material having a low resistance. More specifically, the first and second conductive patterns CP1 and CP2 may include a metal layer having a low resistance. For example, the first and second conductive patterns CP1 and CP2 may be formed of tungsten.

The gate stack structures GST1 and GST2 are isolated from each other by the slits SI. For example, each slit SI may be disposed between a first gate stack structure GST1 and a second gate stack structure GST2, which are adjacent to each other in the second direction II, to allow the first and second gate stack structures GST1 and GST2 to be isolated from each other.

Due to features of a manufacturing process, an oxidation region OX may remain on a sidewall of the etch stop pattern ES adjacent to the slit SI.

The etch stop pattern ES may be disposed in various forms in the cell array region CAR.

For example, referring to FIG. 2A, the etch stop pattern ES may be divided into a first pattern P1 and a second pattern P2 by an isolation insulating layer ISO. The first pattern P1 and the second pattern P2 do not surround the vertical channels VCH but are disposed to overlap with both ends of each of the gate electrodes CP1 and CP2. The isolation insulating layer ISO is disposed in the same layer as the etch stop pattern ES. That is, the isolation insulating layer ISO is disposed between the first conductive pattern CP1 and the second conductive pattern CP2, which are adjacent to each other. The isolation insulating layer ISO may extend in the second and third directions II and III to surround the vertical channels VCH between the first pattern P1 and the second pattern P2. According to the above-described structure, the first pattern P1 and the second pattern P2 are opposite to each other with the isolation insulating layer ISO interposed therebetween.

The interlayer insulating layers ILD1 and ILD2 and the gate electrodes CP1 and CP2 protrude farther toward the slit SI than the isolation insulating layer ISO. As shown in FIG. 2A, when the etch stop pattern ES overlaps with only a partial region of the gate electrodes CP1 and CP2, a parasitic gap caused by the etch stop pattern ES can be reduced. If the parasitic gap is reduced, it is possible to improve the read operation speed and program operation speed of the semiconductor device.

Referring to FIG. 2B, the etch stop pattern ES may extend parallel to the gate electrodes CP1 and CP2 and the interlayer insulating layers ILD1 an ILD2 to surround the vertical channels VCH.

Referring to FIGS. 2A and 2B, the well doped structure WD is disposed under the gate stack structures GST1 and GST2, and may be spaced apart from the gate stack structures GST1 and GST2. The well doped structure WD may extend in the second II and third III directions and be overlapped by the gate stack structures GST1 and GST2. The pipe channel PCH is disposed between the gate stack structures GST1 and GST2 and the well doped structure WD.

The well doped structure WD may be formed of at least one doped silicon layer including a first conductivity type dopant. The first conductivity type dopant may be a p-type dopant such that the well doped structure WD can be used as a well body. The concentration of the first conductivity type dopant becomes lower with proximity to the gate stack structures GST1 and GST2 in the well doped structure WD.

For example, the well doped structure WD may be formed in a stacked structure of a first doped silicon layer DIA including the first conductivity type dopant at a first concentration and a second doped silicon layer DIB including the first conductivity type dopant at a second concentration lower than the first concentration. The concentration of the first conductivity type dopant may gradually decrease with proximity to the gate stack structures GST1 and GST2 in the second doped silicon layer DIB.

The well doped structure WD is connected to the second horizontal part HR2 of the channel pattern CH by the well-channel contact structure WCC, and the source contact line SCL is connected to the first horizontal part HR1 of the channel pattern CH.

According to the above-described structure, different current flow paths may be achieved according to operations of the semiconductor device.

For example, during a read operation of the semiconductor device, a first current flow path may be formed in the channel pattern CH between the capping pattern CAP connected to the bit line (not shown) and the source contact line SCL. For the read operation, the bit line precharged at a predetermined level may be connected to the channel pattern CH via the capping pattern CAP. Also, for the read operation, a turn-on voltage may be applied to the drain select line DSL and the source select line SSL. If a voltage level applied to the word lines WL during the read operation is higher than threshold voltages of memory cell transistors connected to the word lines WL, then a channel may be formed along the first current flow path in the channel pattern CH between the capping pattern CAP and the source contact line SCL, and the precharge level of the bit line may be discharged through a ground electrically connected to the source contact line SCL.

During an erase operation of the semiconductor device, a second current flow path may be formed in the channel pattern CH between the capping pattern CAP connected to the bit line (not shown) and the well doped structure WD. For the erase operation, an erase voltage may be applied to the well doped structure WD. Holes may be injected into the channel pattern CH along the second current flow path by the erase voltage applied to the well doped structure WD.

Hereinafter, the source contact line SCL and the well-channel contact structure WCC, which are connected to the channel pattern CH, are described in more detail.

The sidewall insulating layer SWI may be disposed on the protrusion part PP of the first horizontal part HR1 and an end portion of the multi-layered memory pattern ML extending to cover the protrusion part PP. The sidewall insulating layer SWI extends in the first direction I to cover a sidewall of each of the stack structures GST1 and GST2.

The source contact line SCL may be formed on the sidewall insulating layer SWI to fill in the slit SI. The source contact line SCL may extend to protrude farther toward the well doped structure WD than the sidewall insulating layer SWI, and the source contact line SCL may be in contact with a sidewall of the first horizontal part HR1. The source contact line SCL may extend up to the inside of the gap-fill insulating layer FI disposed between the first horizontal part HR1 and the second horizontal part HR2. In particular, the source contact line SCL is in contact with a sidewall of the protrusion part PP of the first horizontal part HR1.

The source contact line SCL may extend in the third direction III, as does the slit SI. The source contact line SCL may include a doped silicon layer SS, a metal silicide layer SC, and a metal layer MS. The doped silicon layer SS may include a second conductivity type dopant.

The second conductivity type dopant may be an n-type dopant. The metal silicide layer SC is disposed on the doped silicon layer SS, and the metal layer MS is disposed on the metal silicide layer SC. The metal silicide layer SC and the metal layer MS have a low resistance as compared with the doped silicon layer SS, and can lower the resistance of the source contact line SCL. The metal silicide layer SC may include tungsten silicide, nickel silicide, etc. The metal layer MS may include tungsten, etc. The source contact line SCL may further include a barrier metal layer BM. The barrier metal layer BM extends along an interface between the metal layer MS and the sidewall insulating layer SWI and an interface between the metal silicide layer SC and the metal layer MS. The barrier metal layer BM prevents the diffusion of metal, and may include a titanium nitride layer, a tungsten nitride layer, a tantalum nitride layer, and the like.

The doped silicon layer SS of the source contact line SCL is in contact with the protrusion part PP. The second conductivity type dopant in the doped silicon layer SS may be diffused into the protrusion part PP and the first horizontal part HR1 adjacent to the protrusion part PP to define a source junction JN in the channel pattern CH. The multi-layered memory pattern ML disposed between the source junction JN and the source select line SSL may serve as a gate insulating layer.

The well-channel contact structure WCC is in contact with the well doped structure WD by penetrating the gap-fill insulating pattern FI and the second horizontal part HR2 under the source contact line SCL. The well-channel contact structure WCC is in contact with a sidewall of the second horizontal part HR2 and is overlapped by the source contact line SCL. The well-channel contact structure WCC may extend in the third direction III parallel to the source contact line SCL. The well-channel contact structure WCC may be formed of a silicon layer. The first conductivity type dopant diffused from the well doped structure WD may be dispersed in the well-channel contact structure WCC.

An inter-well-source insulating layer WSI may be disposed between the source contact line SCL and the well-channel contact structure WCC. The inter-well-source insulating layer WSI may allow the source contact line SCL and the well-channel contact structure WCC to be structurally isolated from each other. Thus, the flow of current can be controlled to face the source contact lines SCL in program and read operations, and holes can be supplied toward the channel pattern CH through the well doped structure WD in an erase operation. Accordingly, in embodiments of the present disclosure, operational characteristics of the semiconductor device can be improved. The inter-well-source insulating layer WSI may be formed of an oxide layer. For example, the inter-well-source insulating layer WSI may be formed by oxidizing a portion of the well-channel contact structure WCC.

The semiconductor device, according to embodiments of the present disclosure, may further include a second blocking insulating layer BI2. The second blocking insulating layer BI2 may extend along interfaces between the interlayer insulating layers ILD1 and ILD2 and the gate electrodes CP1 and CP2, interfaces between the interlayer insulating layers ILD1 and ILD2 and the sidewall insulating layer SWI, an interface between the first conductive pattern CP1 and the multi-layered memory pattern ML, interfaces between the vertical channels VCH and the gate electrodes CP1 and CP2, and an interface between the etch stop pattern ES and the sidewall insulating layer SW1. The second blocking insulating layer BI2 may be formed in a shape that allows sidewalls of the gate electrodes CP1 and CP2 facing the source contact line SCL and the sidewall insulating layer SWI to be opened therethrough. In other words, the second blocking insulating layer BI2 might not cover the sidewalls of the gate electrodes CP1 and CP2 facing the source contact line SCL and the sidewall insulating layer SWI.

A protective layer PA may remain between the second horizontal part HR2 and the well doped structure WD. The protective layer PA may be an oxide layer.

The etch stop pattern ES, described with reference to FIGS. 2A and 2B, remains between the gate electrodes CP1 and CP2 due to the features of the manufacturing process. For some embodiments, the depth where the slit SI is formed can be precisely controlled using the position at which the etch stop pattern ES is disposed.

According to embodiments of the present disclosure, described with reference to FIGS. 2A and 2B, a source select transistor is defined at an intersection portion of the source select line SSL and the vertical channel VCH, memory cell transistors are defined at intersection portions of the word lines WL and the vertical channel VCH, and a drain select transistor is defined at an intersection portion of the drain select line DSL and the vertical channel VCH. The source select transistor, the memory cell transistors, and the drain select transistor are connected in series by the vertical channel VCH to form a memory string having a three-dimensional structure.

According to embodiments of the present disclosure, described with reference to FIGS. 2A and 2B, the interface between the channel pattern CH and the source contact line SCL can be formed without any bending, and the interface between the channel pattern CH and the well-channel contact structure WCC can be formed without any bending. Accordingly, it is possible to prevent a phenomenon that decreases channel current due to bending.

Figure 3:
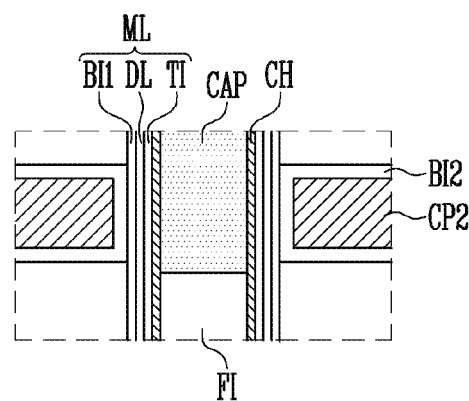
FIG. 3 shows an enlarged view of region A shown in each of FIGS. 2A and 2B.

FIG. 3 shows an enlarged view of region A shown in each of FIGS. 2A and 2B.

Referring to FIG. 3, the multi-layered memory pattern ML may include a tunnel insulating layer TI, a data storage layer DL, and a first blocking insulating layer BI1, which are stacked on the outer wall of the channel pattern CH.

The tunnel insulating layer TI may be formed of an insulating layer through which charges can tunnel. For example, the tunnel insulating layer TI may be formed of a silicon oxide layer.

The data storage layer DL may store data changed using Fowler-Nordheim tunneling caused by a difference in voltage between the word lines WL and the vertical channel VCH, which are shown in FIGS. 2A and 2B. To this end, the data storage layer DL may be formed of various materials. For example, the data storage layer DL may be formed of a nitride layer in which charges can be trapped. In addition, the data storage layer DL may store data in various manners, and the data storage layer DL may include silicon, a phase change material, nanodots, and the like.

The first blocking insulating layer BI1 may include an oxide layer capable of blocking charges.

The second blocking insulating layer BI2 extending along the second conductive pattern CP2 along a surface of each of the gate electrodes including the second conductive pattern CP2 may be formed of an insulating material having a dielectric constant higher than that of the first blocking layer BI1. For example, the second blocking insulating layer BI2 may be formed of an aluminum oxide layer. Although not shown in the drawing, a barrier layer for preventing each of the gate electrodes and the second blocking insulating layer BI2 from being in direct contact with each other may be further formed at an interface between each of the gate electrodes and the second blocking insulating layer BI2. The barrier layer may include a titanium nitride layer, a tungsten nitride layer, a tantalum nitride layer, and the like.

The capping pattern CAP and the gap-fill insulating pattern FI are surrounded by the channel pattern CH.

Figure 4A:
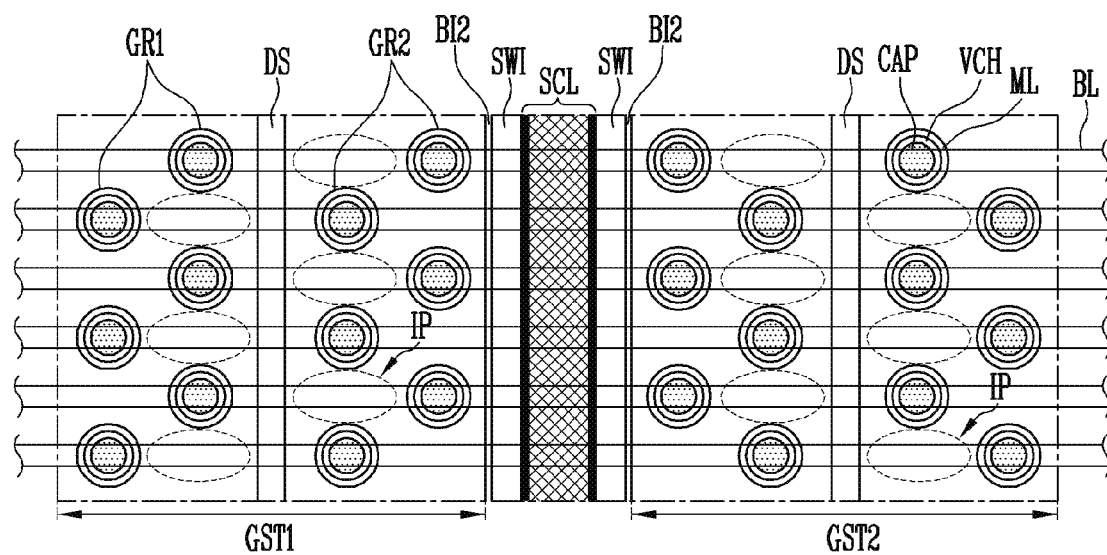
FIGS. 4A and 4B show plan views illustrating a layout of supporting bodies and vertical channels according to an embodiment of the present disclosure.
Figure 4B:
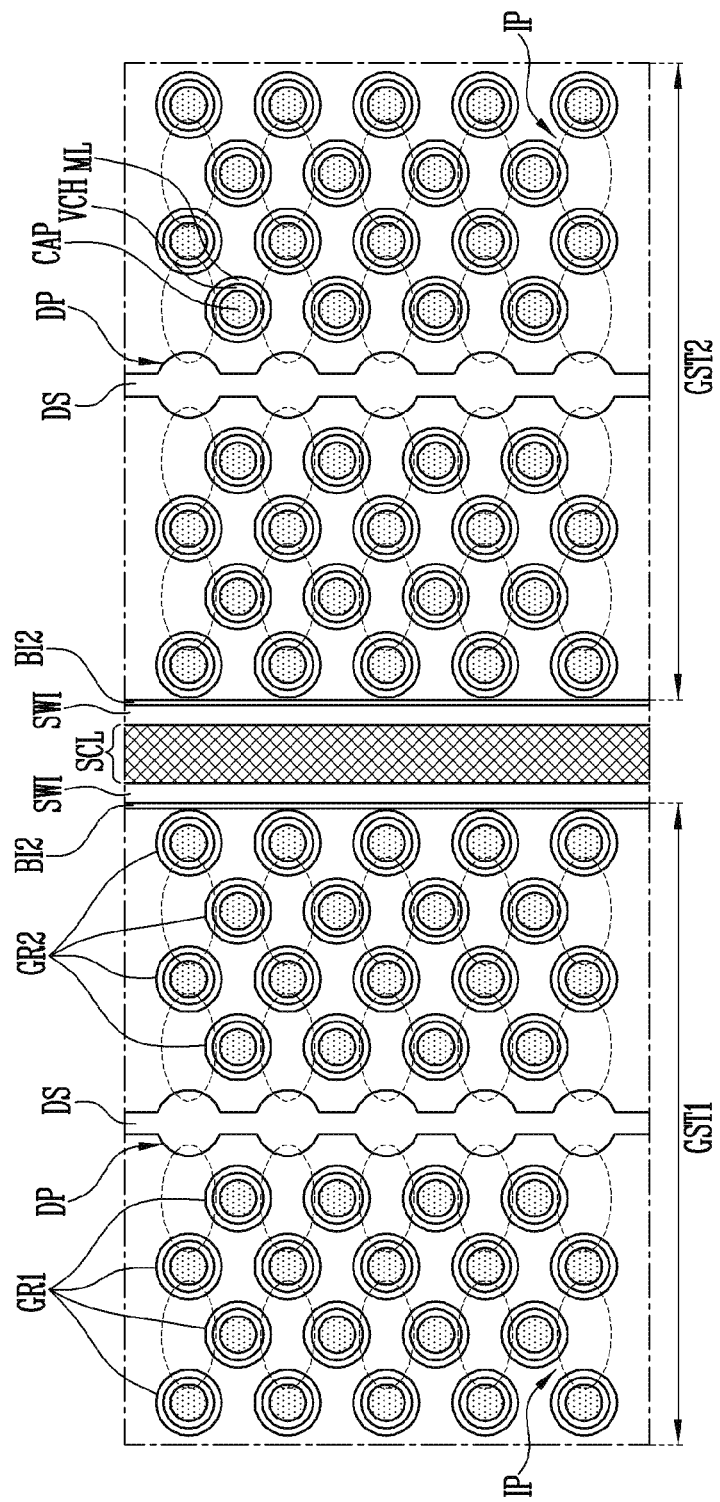

FIGS. 4A and 4B show plan views illustrating a layout of supporting bodies and vertical channels. FIG. 4A shows a plan view of the semiconductor device shown in FIG. 2A or 2B. FIG. 4B shows a modification of the layout of the supporting bodies and the vertical channels.

Referring to FIGS. 4A and 4B, each of the vertical channels VCH is surrounded by the multi-layered memory pattern ML and may be formed to surround the capping pattern CAP.

The vertical channels VCH penetrating each of the gate stack structures GST1 and GST2 may be divided into a first group GR1 and a second group GR2, which are disposed with the drain isolation insulating layer DS interposed therebetween. In order to improve an arrangement density of memory strings, the vertical channels VCH of the first group GR1 and the vertical channels VCH of the second group GR2 may be arranged in a zigzag pattern.

The gate stack structures GST1 and GST2 may be disposed in the second direction II to be adjacent to each other with the source contact line SCL interposed therebetween, and may be insulated from the source contact line SCL by the sidewall insulating layer SWI. The second blocking insulating layer BI2 may remain between each of the gate stack structures GST1 and GST2 and the sidewall insulating layer SWI.

The supporting bodies IP are disposed under the gate stack structures GST1 and GST2 as described with reference to FIGS. 2A and 2B. Because the supporting bodies IP are covered by the gate stack structures GST1 and GST2 as viewed from above in FIGS. 4A and 4B, the supporting bodies IP are represented with broken lines. The supporting bodies IP, as shown in FIG. 4A, may be disposed between the vertical channels VCH so as not to overlap with the vertical channels VCH. Alternatively, the supporting bodies IP, as shown in FIG. 4B, may overlap with a portion of each of the vertical channels VCH.

Referring to FIGS. 4A and 4B, the supporting bodies IP may be disposed between adjacent vertical channels VCH. The supporting bodies IP may be arranged in a zigzag pattern. The layout of the supporting bodies IP is not limited to the examples shown in FIGS. 4A and 4B, and the supporting bodies IP may have different arrangements in other embodiments.

Referring to FIG. 4A, each of the vertical channels VCH may be connected to a corresponding bit line BL. The layout of the bit lines BL is not limited to the example shown in FIG. 4A. Different layouts for the bit lines BL may be realized in other embodiments. The bit line BL may be disposed above the capping pattern CAP. One bit line BL may be commonly connected to one of the vertical channels VCH of the first group GR1 and one of the vertical channels VCH of the second group GR2.

The vertical channels VCH may arranged in lines along the direction intersecting the bit lines BL to define channel columns. The number of channel columns defined by the vertical channels VCH of the first group GR1, which penetrate each of the gate stack structures GST1 and GST2, and the number of channel columns defined by the vertical channels VCH of the second group GR2, which penetrate each of the gate stack structures GST1 and GST2, may be variously designed. For example, as shown in FIG. 4A, the channel columns defined by the vertical channels VCH of the first group GR1 may be configured with first and second columns, and the channel columns defined by the vertical channels VCH of the second group GR2 may be configured with first and second columns.

Referring to FIG. 4B, the channel columns defined by the vertical channels VCH of the first group GR1 may be configured with first to fourth columns, and the channel columns defined by the vertical channels VCH of the second group GR2 may be configured with first to fourth columns. In addition, the channel columns defined by the vertical channels VCH of the first group GR1 and the channel columns defined by the vertical channels VCH of the second group GR2 may be configured with a plurality of columns, i.e., four or more columns.

In FIG. 4B, a layout for bit lines is not illustrated for convenience of description. However, the bit lines may be connected to the capping patterns CAP as described for FIG. 4A. In some cases, a bit line contact structure (not shown) may be further disposed between a bit line and a corresponding capping pattern CAP.

The drain isolation insulating layer DS may overlap with dummy plugs DP. The dummy plugs DP may be arranged in a line extending along the drain isolation insulating layer DS. The dummy plugs DP may be formed using a process for forming the vertical channels VCH.

Figure 5A:
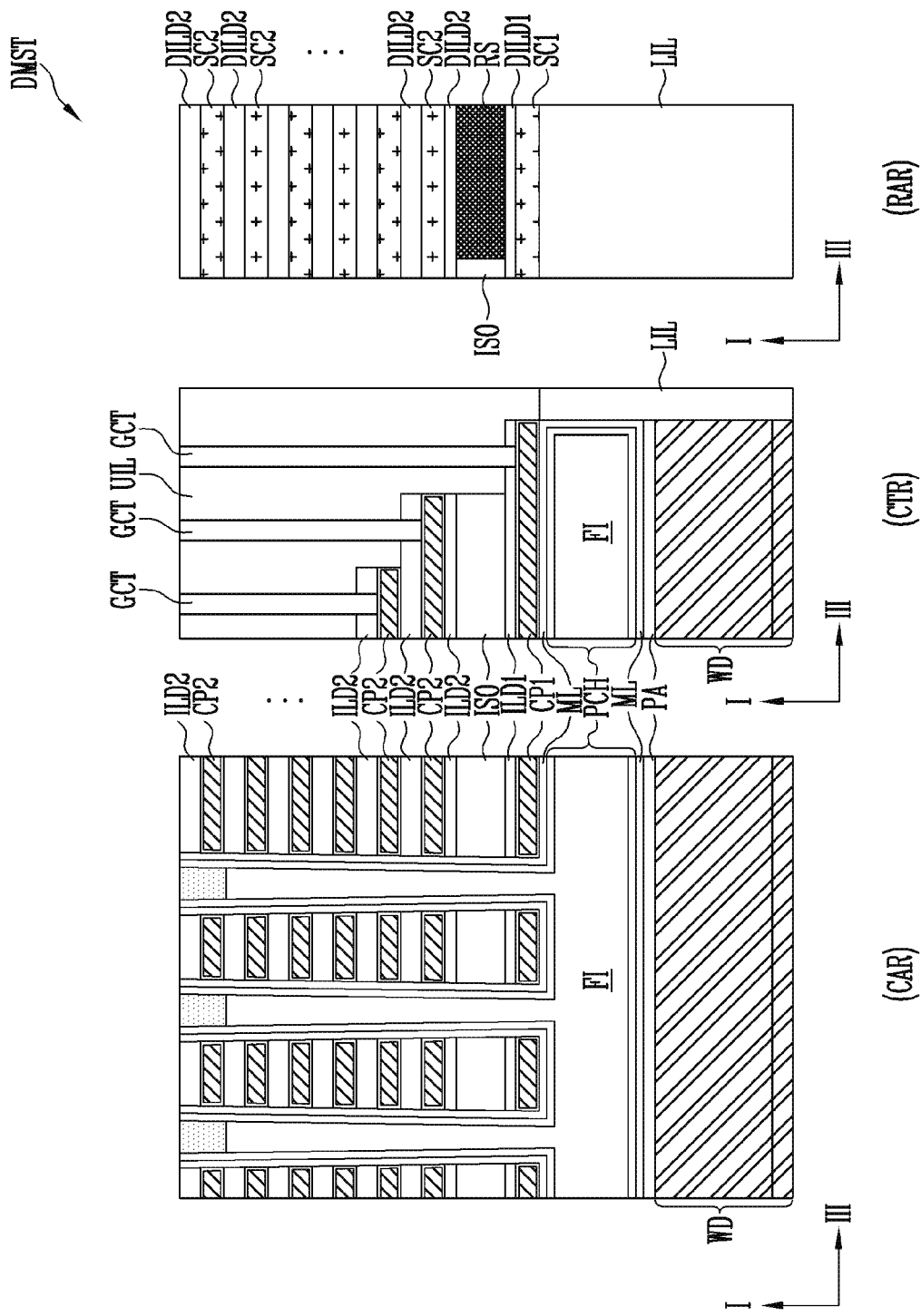
FIGS. 5A and 5B show sectional views illustrating structures for regions of the semiconductor devices according to embodiments of the present disclosure.
Figure 5B:
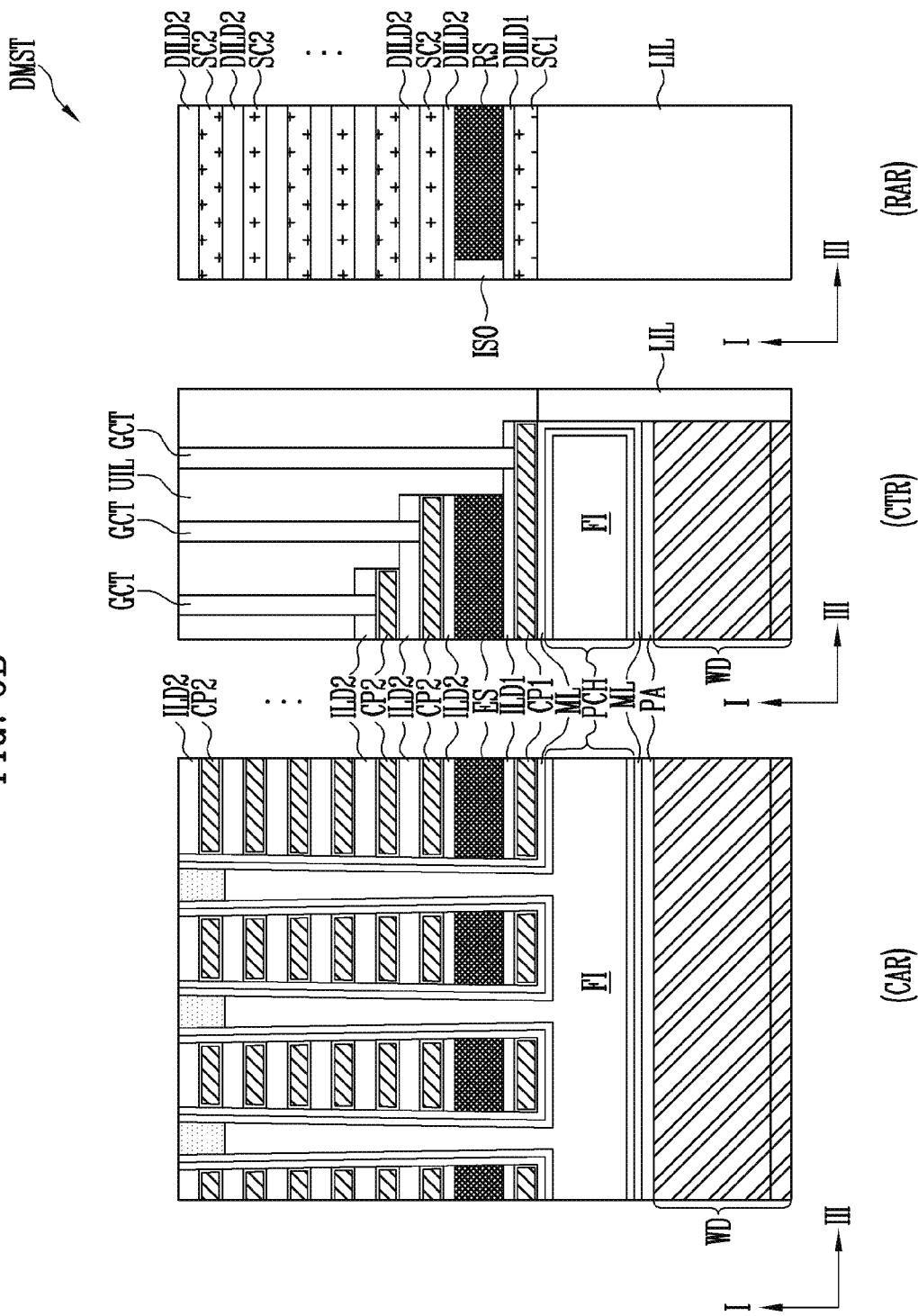

FIGS. 5A and 5B show sectional views illustrating structures for regions of the semiconductor devices according to embodiments of the present disclosure. For some embodiments, FIGS. 5A and 5B show sectional views of the regions CAR, CTR, and RAR shown in FIG. 1, which are taken along the third direction III. For convenience of description, FIGS. 5A and 5B illustrate only portions of the structures for the regions CAR, CTR, and RAR. A structure of the cell array region CAR shown in FIG. 5A corresponds to the cell array region shown in FIG. 2A, and a structure of the cell array region CAR shown in FIG. 5B corresponds to the cell array region shown in FIG. 2B.

Referring to FIGS. 5A and 5B, the well doped structure WD, the pipe channel PCH, the multi-layered memory pattern ML, and the protective layer PA in the cell array region CAR extend toward the contact region CTR. A lower insulating layer LIL is disposed in the resistive element region RAR in the same layer as for the well doped structure WD, the pipe channel PCH, the multi-layered memory pattern ML, and the protective layer PA in the cell array region CAR and the contact region CTR. The well doped structure WD and the pipe channel PCH may be isolated from the resistive element region RAR by the lower insulating layer LIL. Although not shown in the drawings, the well doped structure WD and the lower insulating layer LIL may be formed on a substrate (not shown) including driving transistors constituting a peripheral circuit.

The gate electrodes CP1 and CP2 and the interlayer insulating layers ILD1 and ILD2 in the cell array region CAR may extend to the contact region CTR. The gate electrodes CP1 and CP2 are stacked in the contact region CTR while forming a step structure.

The gate electrodes CP1 and CP2 exposed through a step structure in the contact region CTR may be covered by a planarization insulating layer UIL. The planarization insulating layer UIL may be penetrated by gate contact plugs GCT disposed in the contact region CTR. The gate contact plugs GCT may be in contact with the gate electrodes CP1 and CP2 and may extend along the first direction I to penetrate at least one interlayer insulating layer ILD1 or ILD2 and the planarization insulating layer UIL.

A resistor pattern RS disposed in the resistive element region RAR is disposed in the same layer as an isolation layer ISO and the etch stop pattern ES. In order to realize simplification of a process, the resistor pattern RS and the etch stop pattern ES may be formed by patterning a first conductive layer. The first conductive layer may be a polysilicon layer. The resistor pattern RS may be formed to have a thickness equal to that of the etch stop pattern ES. As a result, the resistor pattern RS may be formed thicker in the first direction I than each of the gate electrodes CP1 and CP2.

A dummy stack structure DMST may remain in the resistive element region RAR. The dummy stack structure DMST overlaps the resistor pattern RS. The dummy stack structure DMST may include dummy insulating layers DILD1 and DILD2 disposed in the same layer as the interlayer insulating layers ILD1 and ILD2 and include sacrificial insulating layers SC1 and SC2 disposed in the same layer as the gate electrodes CP1 and CP2.

The dummy insulating layers DILD1 and DILD2 and the interlayer insulating layers ILD1 and ILD2 may be formed of the same material.

The sacrificial insulating layers SC1 and SC2 are material layers that remain following a process of manufacturing a semiconductor layer, and the sacrificial insulating layers SC1 and SC2 may be nitride layers. The sacrificial insulating layers SC1 and SC2 may be divided into a first sacrificial insulating layer SC1 and second sacrificial insulating layers SC2. The first sacrificial insulating layer SC1 is disposed under the resistor pattern RS and is disposed in the same layer as the first conductive pattern CP1. The second sacrificial insulating layers SC2 are disposed above the resistor pattern RS and are disposed in the same layers as the second conductive patterns CP2.

The resistor pattern RS and the dummy stack structure DMST may be disposed on the lower insulating layer LIL in the resistive element region RAR. According to the above-described structure, the resistor pattern RS is disposed between the first sacrificial insulating layer SC1 and the second sacrificial insulating layers SC2, which are adjacent to each other in the first direction I. The resistor pattern RS may remain thicker than each of the first sacrificial insulating layer SC1 and the second sacrificial insulating layers SC2.

FIG. 6 shows a flowchart schematically illustrating a manufacturing method of a semiconductor device according to a number of embodiments of the present disclosure.

Referring to FIG. 6, the manufacturing method of the semiconductor device may include operations ST1 to ST23. For some embodiments, driving transistors constituting a driving circuit for driving the semiconductor device may be formed on a substrate before the operation ST1 is performed. In this case, the operation ST1 may be performed on the substrate including the driving transistors. For some embodiments, contact plugs including gate contact plugs may be formed and signal lines including bit lines may be formed after the operation ST23 is performed.

Operation ST1 includes forming a lower structure including a well doped structure, a sacrificial structure, and a lower insulating layer. For some embodiments, the well doped structure and the sacrificial structure are disposed in the first region AR1 shown in FIG. 1, and the lower insulating layer is disposed in the same layer as the well doped structure and the sacrificial structure in the second region AR2 shown in FIG. 1.

Operation ST3 includes forming a first stack structure. For some embodiments, the first stack structure is entirely formed in the first region AR1 and the second region AR2, which are shown in FIG. 1.

Operation ST5 includes forming a first conductive layer. For some embodiments, the first conductive layer is entirely formed in the first region AR1 and the second region AR2, which are shown in FIG. 1.

Operation ST7 includes forming an etch stop pattern disposed in the first region AR1 shown in FIG. 1 and a resistor pattern disposed in the second region AR2 shown in FIG. 1 by patterning the first conductive layer.

Operation ST9 includes forming a second stack structure. For some embodiments, the second stack structure is entirely formed in the first region AR1 and the second region AR2, which are shown in FIG. 1.

Operation ST11 includes forming a drain isolation insulating layer. The drain isolation insulating layer may be formed to penetrate a portion of the second stack structure disposed in the first region AR1 shown in FIG. 1.

Operation ST13 includes isolating each of the first stack structure and the second stack structure into a cell stack structure and a dummy stack structure. The cell structure remains in the first region AR1 shown in FIG. 1, and the dummy stack structure remains in the second region AR2 shown in FIG. 1. The cell stack structure may extend from the cell array region CAR shown in FIG. 1 to the contact region CTR shown in FIG. 1, and be patterned in a step structure in the contact region CTR.

Operation ST15 includes forming a channel layer surrounded by a multi-layered memory layer in the cell stack structure.

Operation ST17 includes forming a slit penetrating the cell stack structure. The slit may extend from the cell array region CAR shown in FIG. 1 to the contact region CTR shown in FIG. 1.

Operation ST19 includes replacing first and second sacrificial layers of the cell stack structure with conductive patterns. At this time, first and second sacrificial layers of the dummy stack structure remain without being replaced with conductive patterns.

Operation ST21 includes forming a well-channel contact structure connecting the well doped structure to the channel layer.

Operation ST23 includes forming a source contact line connected to the channel layer.

Hereinafter, manufacturing methods of semiconductor devices according to embodiments of the present disclosure are described in detail with reference to FIGS. 7A to 7G, FIGS. 8A to 8D, FIGS. 9A to 9D, FIGS. 10A to 10C, and FIGS. 11A to 11F. A cell array region CAR, a resistive element region RAR, and a contact region CTR, which are shown in FIGS. 7A to 7G, FIGS. 8A to 8D, FIGS. 9A to 9D, FIGS. 10A to 10C, and FIGS. 11A to 11F, are the same as described for FIG. 1, and therefore, descriptions of the regions CAR, RAR, and CTR are omitted here.

FIGS. 7A to 7G, FIGS. 8A to 8D, FIGS. 9A to 9D, FIGS. 10A to 10C, and FIGS. 11A to 11F illustrate an embodiment of a manufacturing method of the semiconductor device shown in FIGS. 2A and 5A.

FIGS. 7A to 7G show sectional views illustrating the operations ST1 to ST13 indicated in FIG. 6.

Referring to FIG. 7A, the operation ST1 may include: sequentially stacking a first semiconductor layer 101 and a second semiconductor layer 103; forming a protective layer 107 on the second semiconductor layer 103; forming a first pipe sacrificial layer 109 on the protective layer 107; forming a supporting body 111 penetrating the second semiconductor layer 103 from the first pipe sacrificial layer 109; removing the first pipe sacrificial layer 109, the second semiconductor layer 103, the protective layer 107, and the first semiconductor layer 101 in the resistive element region RAR; and forming a lower insulating layer 113.

The first semiconductor layer 101 may be formed by depositing a doped silicon layer including a first conductivity type dopant. Forming the second semiconductor layer 103 may include forming an undoped silicon layer and performing a heat treatment process such that the first conductivity type dopant in the first semiconductor layer 101 can be diffused into the undoped silicon layer. Therefore, each of the first and second semiconductor layers 101 and 130 may include a first conductivity type dopant. The first conductivity type dopant may be dispersed in the second semiconductor layer 103 at a concentration lower than a concentration for the first semiconductor layer 101. The first conductivity type dopant may be dispersed with a gradually decreasing concentration with distance from the first semiconductor layer 101. The first semiconductor layer 101 and the second semiconductor layer 103, which include the first conductivity type dopant, are removed in the resistive element region RAR, and extend from the cell array region CAR to the contact region CTR to remain as a well doped structure 105. For some embodiments, the first conductivity type dopant is a p-type dopant.

The protective layer 107 is formed of a material having an etching rate different from an etching rate of the first pipe sacrificial layer 109 to protect the well doped structure 105 during a subsequent etching process of removing the first pipe sacrificial layer 109. For example, the protective layer 107 may be formed of an oxide layer.

The first pipe sacrificial layer 109 may be formed of a material different from that of the protective layer 107. For example, the first pipe sacrificial layer 109 may be formed of a doped silicon layer including an n-type dopant.

The supporting body 111 may be formed in plurality, as described for FIGS. 4A and 4B, and may be disposed in various shapes to support a first stack structure and a second stack structure, which are formed in a subsequent process. For example, the supporting body 111 may be formed in an elliptical shape, as shown in FIGS. 4A and 4B, or may be formed in a line shape extending along one direction. The supporting body 111 may be formed of an oxide layer. Forming the supporting body 111 may include forming lower holes extending to penetrate the well doped structure 105 from the first pipe sacrificial layer 109 and filling the lower holes with an oxide layer. The supporting body 111 may be disposed in the cell array region CAR.

The lower insulating layer 113 may be simultaneously formed with the supporting body 111, or the lower insulating layer 113 may be formed using a separate mask process distinguished from a mask process for forming the supporting body 111. The lower insulating layer 113 is a pattern that replaces the first pipe sacrificial layer 109, the protective layer 107, the second semiconductor layer 103, and the first semiconductor layer 101 in the resistive element region RAR. More specifically, the operation of forming the lower insulating layer 113 may include removing the first pipe sacrificial layer 109, the protective layer 107, the second semiconductor layer 103, and the first semiconductor layer 101 in the resistive element region RAR and depositing an oxide layer in the resistive element region RAR. The lower insulating layer 113 may be entirely disposed in the second region (AR2 of FIG. 1) including the resistive element region RAR. The boundary between the lower insulating layer 113 and the first pipe sacrificial layer 109 and the boundary between the lower insulating layer 113 and the well doped structure 105 may be disposed at a boundary between the first region (AR1 of FIG. 1) and the second region (AR2 of FIG. 1). Top surfaces of the lower insulating layer 113 and the supporting body 111 may be planarized such that a top surface of the first pipe sacrificial layer 109 is exposed.

Referring to FIG. 7B, the operation ST1 may further include forming a trench T1 by etching the first pipe sacrificial layer 109 to a partial thickness from the top surface of the first pipe sacrificial layer 109. As the first pipe sacrificial layer 109 is etched, the supporting body 111 and the lower insulating layer 113 may remain so that they protrude from the first pipe sacrificial layer 109 in the first direction I.

Referring to FIG. 7C, the operation ST1 may further include filling the above-described trench T1 with a second pipe sacrificial layer 115. The second pipe sacrificial layer 115 may be formed of a material layer having a large difference in etching rate with material layers of first and second stack structures to be formed in a subsequent process, or as compared with the first pipe sacrificial layer 109. For example, the second pipe sacrificial layer 115 may be formed of a titanium nitride layer. A surface of the second pipe sacrificial layer 115 may be planarized such that the top surfaces of the supporting body 111 and the lower insulating layer 113 are exposed.

The first pipe sacrificial layer 109 and the second pipe sacrificial layer 115 form a sacrificial structure SA that ensures a space in which a pipe channel is to be disposed. The lower insulating layer 113 may include a sidewall that forms a common surface with sidewalls of the well doped structure 105 and the sacrificial structure SA.

A lower structure LS including the sacrificial structure SA, the well doped structure 105, the supporting body 111, and the lower insulating layer 113 may be divided into a first region AR1 and a second region AR2. The first region AR1 of the lower structure LS is a region in which the well doped structure 105 and the sacrificial structure SA, which are penetrated by the supporting body 111, are stacked. The second region AR2 of the lower structure LS is a region in which the lower insulating layer 113 is disposed. The sacrificial structure SA is formed in a stacked structure of the first pipe sacrificial layer 109 and the second pipe sacrificial layer 115, which have different etching rates. Accordingly, the thickness of the second pipe sacrificial layer 115 can be decreased.

Referring to FIG. 7D, a first stack structure SS1 formed through the operation ST3 extends over the first and second regions AR1 and AR2 of the lower structure LS to overlap with the first and second regions AR1 and AR2 of the lower structure LS, which are described in FIG. 7C. That is, the first stack structure SS1 extends to cover the first region AR1 of the lower structure LS and the second region AR2 of the lower structure LS.

The first stack structure SS1 includes a first sacrificial layer 121 and a first interlayer insulating layer 123 stacked on the first sacrificial layer 121. The first sacrificial layer 121 may be formed of a material selected from materials having an etching rate different from the etching rate of the first interlayer insulating layer 123. For example, the first interlayer insulating layer 123 may include a silicon oxide layer, and the first sacrificial layer 121 may include a nitride layer.

A first conductive layer 125 formed in operation ST5 is formed on the first stack structure SS1. The first conductive layer 125 extends over the first and second regions AR1 and AR2 of the lower structure LS to overlap with the first and second regions AR1 and AR2 of the lower structure LS, which are described in FIG. 7C. That is, the first conductive layer 125 extends to cover the first region AR1 and the second region AR2 of the lower structure LS with the first stack structure SS1 interposed therebetween. The first conductive layer 125 may serve as an etch stop layer in the cell array region CAR while a subsequent process for forming a slit is being performed. The first conductive layer 125 may be used as a resistor pattern in the resistive element region RAR. To this end, the first conductive layer 125 may be formed of a doped poly-silicon layer doped with an n-type dopant.

Figure 7E:
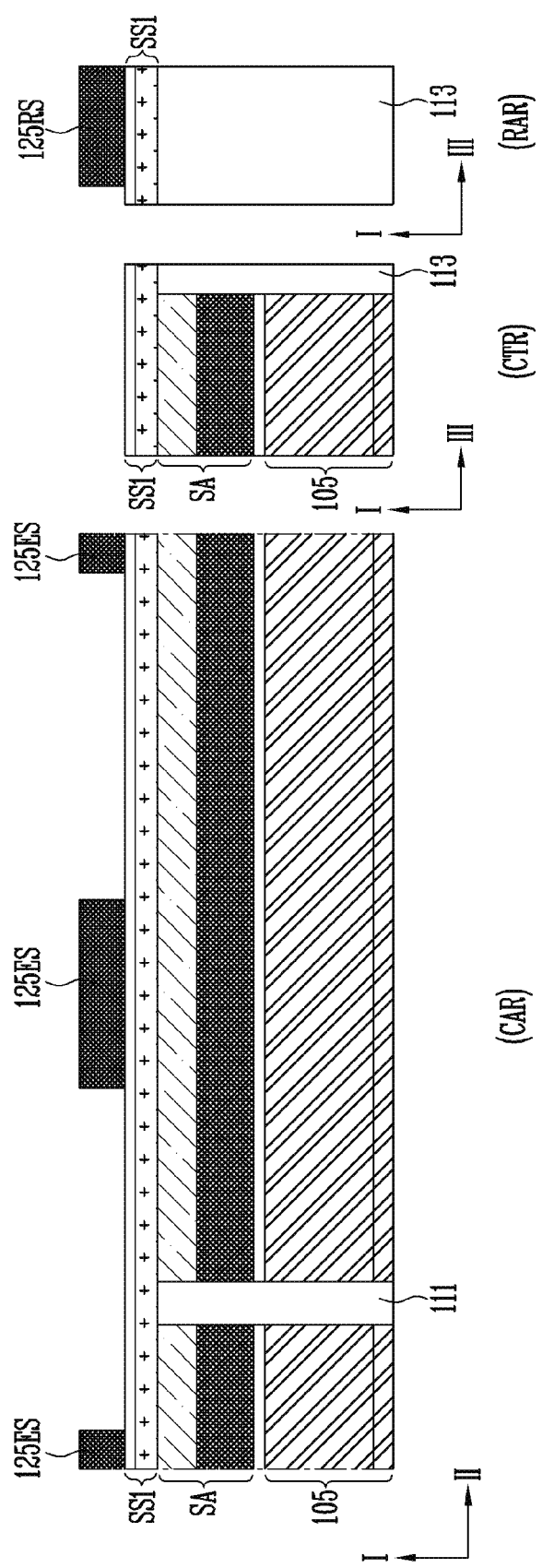

Referring to FIG. 7E, the first conductive layer 125 is etched in operation ST7. Accordingly, the first conductive layer 125 remains as an etch stop pattern 125ES in the cell array region CAR and remains as a resistor pattern 125RS in the resistive element region RAR. The resistor pattern 125RS is isolated from the etch stop pattern 125ES.

The etch stop pattern 125ES may overlap with the well doped structure 105 and may be patterned by considering a region in which holes are to be disposed and a region in which a slit is to be disposed. The region in which the holes are to be disposed is a region in which a portion of a channel layer is filled, and the etch stop pattern 125ES is formed not to overlap with the region in which the holes are to be disposed. The etch stop pattern 125ES may remain in the region in which the slit is to be disposed. The resistor pattern 125RS does not overlap with the well doped structure 105, but overlaps with the lower insulating layer 113.

The etch stop pattern 125ES and the resistor pattern 125RS are formed using one photoresist process. Thus, in the embodiment of the present disclosure, the manufacturing process of the semiconductor device can be simplified.

Figure 7F:
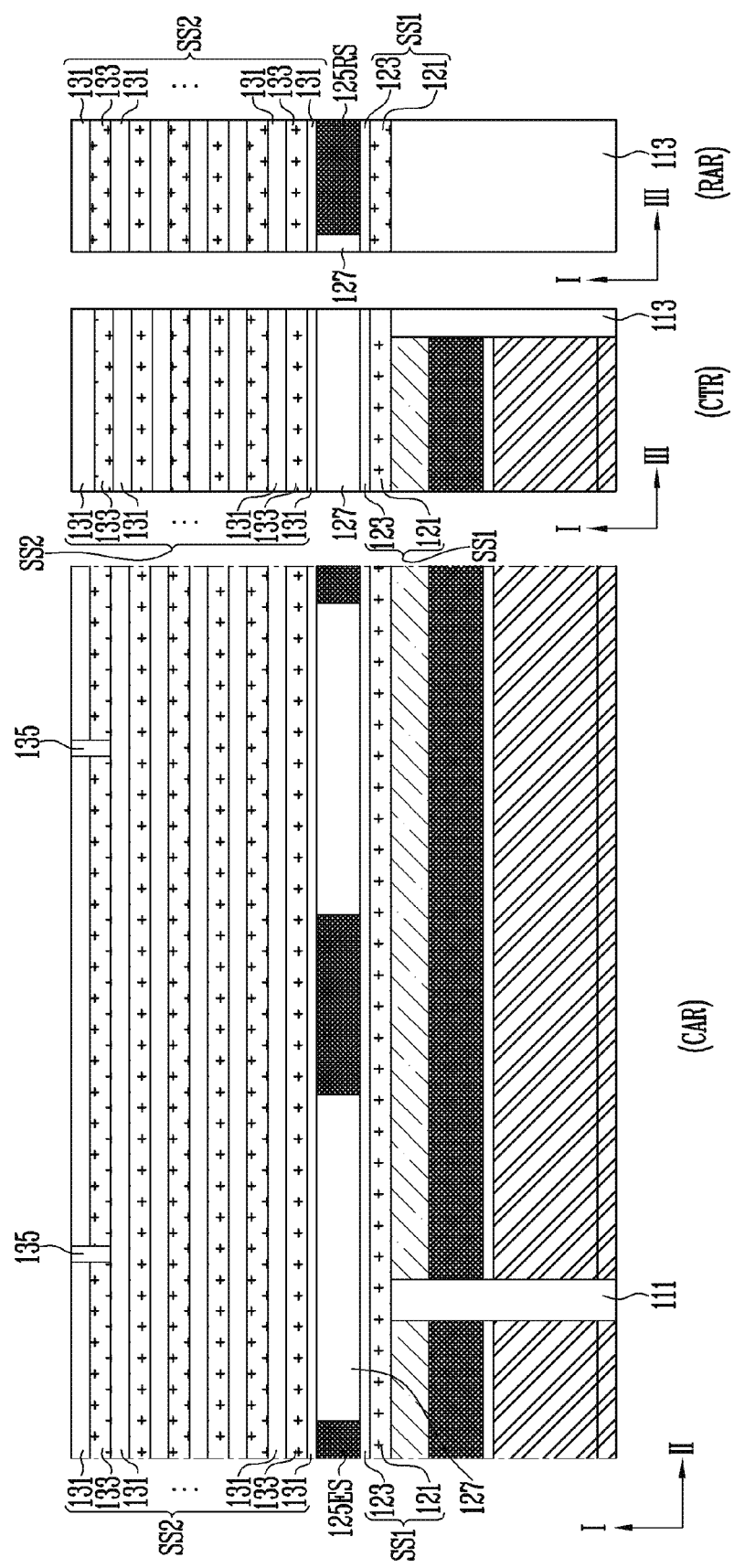

Referring to FIG. 7F, the operation ST7 may further include filling the region in which the first conductive layer 125 is etched with an isolation insulating layer 127. The resistor pattern 125RS may be electrically insulated from the etch stop pattern 125ES by the isolation insulating layer 127. A surface of the isolation insulating layer 127 may be planarized so that top surfaces of the etch stop pattern 125ES and the resistor pattern 125RS are exposed.

Subsequently, the operation ST9 is performed. A second stack structure SS2 formed, which extends along the top surfaces of the etch stop pattern 125ES, the isolation insulating layer 127, and the resistor pattern 125RS. That is, the second stack structure SS2 extends over the first region AR1 including the cell array region CAR and the contact region CTR and extends over the second region AR2 including the resistive element region RAR.

The operation ST9 may include alternately stacking second interlayer insulating layers 131 and second sacrificial layers 133. The second interlayer insulating layers 131 may be formed of the same material as the first interlayer insulating layer 123, and the second sacrificial layers 133 may be formed of the same material as the first sacrificial layer 121. The second interlayer insulating layers 131 may include a silicon oxide layer. The second sacrificial layers 133 may include a nitride layer.

After the second stack structure SS2 is formed, a drain isolation insulating layer 135 may be formed during the operation ST11. The operation ST11 may include forming a drain isolation slit, such that at least one of the second sacrificial layers 133 of the second stack structure SS2 is penetrated, and filling the drain isolation slit with the drain isolation insulating layer 135. The drain isolation insulating layer 135 is formed to isolate drain select lines. The depth to which the drain isolation insulating layer 135 is formed may vary according to design. The drain isolation slit and the drain isolation insulating layer 135 may be omitted in some cases.

Referring to FIG. 7G for the operation ST13, the first stack structure SS1 and the second stack structure SS2 may be etched. At this time, each of the first stack structure SS1 and the second stack structure SS2 may be divided into a cell stack structure CST overlapping with the well doped structure 105 and a dummy stack structure DMST overlapping with the lower insulating layer 113.

An end portion of the cell stack structure CST may be disposed in the contact region CTR and may have a step structure. Forming the step structure may include forming a photoresist pattern (not shown) and etching the first stack structure SS1 and the second stack structure SS2 through an etching process using the photoresist pattern as an etching barrier. The step structure may be formed by repeatedly decreasing the size of the photoresist pattern and etching the first stack structure SS1 and the second stack structure SS2 using the photoresist pattern.

After the cell stack structure CST and the dummy stack structure DMST are divided, a planarization insulating layer 137 may be formed to cover the step structure formed at the end portion of the cell stack structure CST. For an embodiment, the cell stack structure CST overlaps with the well doped structure 105, and the dummy stack structure DMST does not overlap with the well doped structure 105.

FIGS. 8A to 8D are sectional views illustrating the step ST15 shown in FIG. 6.

Referring to FIG. 8A, the operation ST15 may include forming holes 141 that expose the second pipe sacrificial layer 115 of the sacrificial structure SA by penetrating the second stack structure SS2 and the first stack structure SS1, which are patterned as the cell stack structure CST. The holes 141 do not penetrate the region in which the etch stop pattern 125ES is disposed, but may penetrate the isolation insulating layer 127.

When the second pipe sacrificial layer 115 is formed of a material including a metal such as a titanium nitride layer (TiN), it is easy to selectively remove the material layers constituting the first stack structure SS1 and the second stack structure SS2, as compared with the second pipe sacrificial layer 115. Thus, a width of a bottom surface of each of the holes 141 can be widely ensured.

Figure 8B:
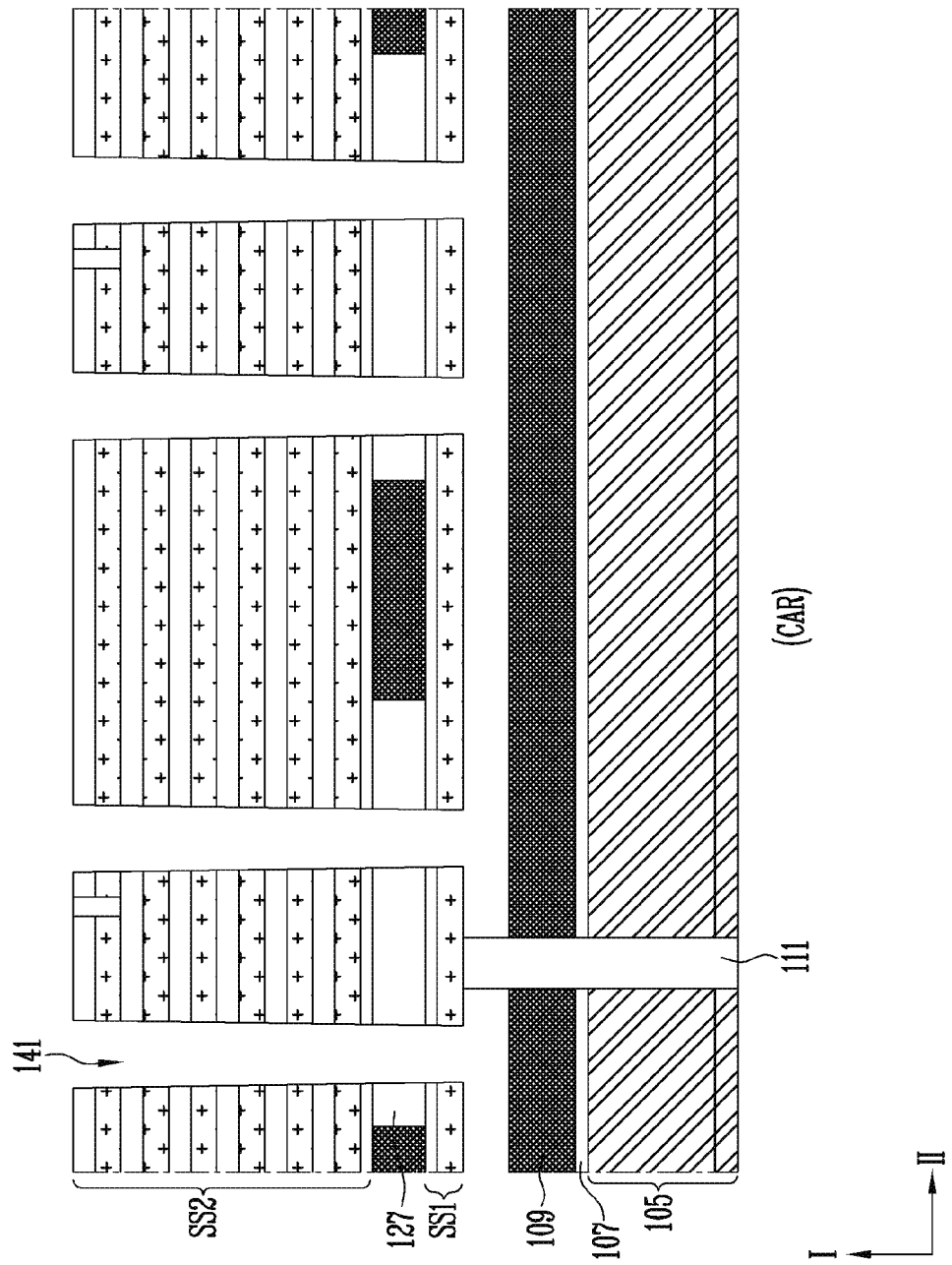

Referring to FIG. 8B, the operation ST15 may include a step of selectively removing the second pipe sacrificial layer 115 of FIG. 8A, which is exposed through the holes 141. Accordingly, the first pipe sacrificial layer 109 is exposed. A wet etching process may be performed to remove the second pipe sacrificial layer 115.

Referring to FIG. 8C, the operation ST15 may include selectively removing the first pipe sacrificial layer 109 of FIG. 8B through the holes 141. To this end, a dry etching process may be performed. At this time, the well doped structure 105 may be protected by the protective layer 107.

A horizontal space 143 connected to the holes 141 may be opened through the processes described in FIGS. 8B and 8C. The horizontal space 143 is defined between the well doped structure 105, protected by the protective layer 107, and the first stack structure SS1. A sidewall of the supporting body 111 may be exposed through the horizontal space 143.

The horizontal space 143 is supported by the supporting body 111 such that the gap of the horizontal space 143 can be maintained.

Figure 8D:
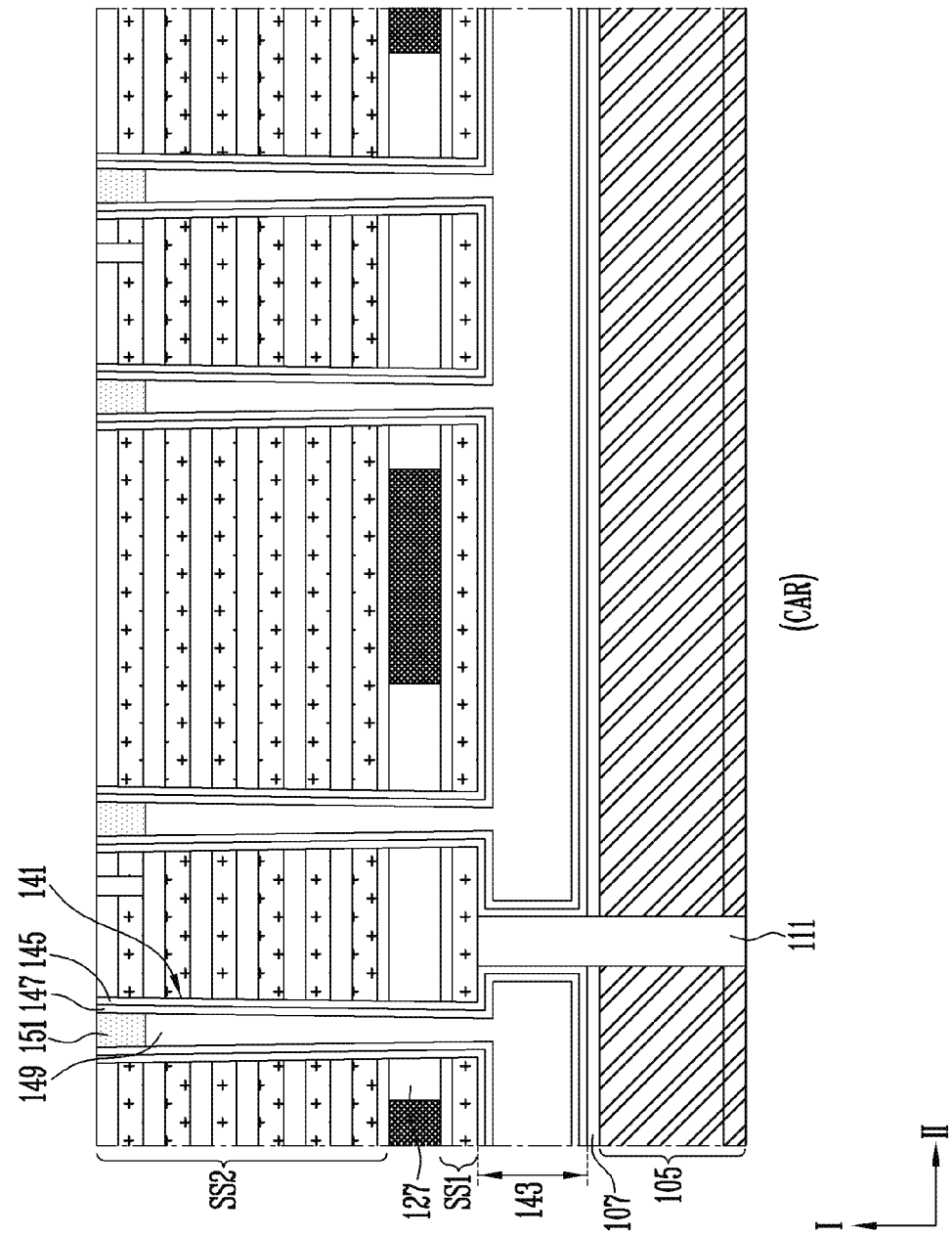

Referring to FIG. 8D, the operation ST15 may include forming a multi-layered memory layer 145 extending along surfaces of the holes 141, a surface of the horizontal space 143, and the sidewall of the supporting body 111. The operation of forming the multi-layered memory layer 145 may include forming a first blocking insulating layer, forming a data storage layer on the first blocking insulating layer, and forming a tunnel insulating layer on the data storage layer. The structure and material of each of the first blocking insulating layer, the data storage layer, and the tunnel insulating layer are the same as described for FIG. 3.

The operation ST15 may include forming a channel layer 147 on a surface of the multi-layered memory layer 145. The channel layer 147 may extend along the surfaces of the holes 141, the surface of the horizontal space 143, and the sidewall of the supporting body 111, and be surrounded by the multi-layered memory layer 145.

The channel layer 147 may be formed of a semiconductor layer. For example, the channel layer 147 may be formed by depositing a silicon layer. The channel layer 147 may be formed as a layer integrated without any boundary surface.

The operation ST15 may further include forming a gap-fill insulating layer 149 extending to the inside of the horizontal space 143 from the inside of the holes 141. The gap-fill insulating layer 149 is surrounded by the channel layer 147. The operation of forming the gap-fill insulating layer 149 may include filling the holes 141 and the horizontal space 143 with a material layer having liquidity and curing the material layer having liquidity. Polysilazane (PSZ), for example, may be used as the material layer having liquidity.

An operation of recessing a portion of the gap-fill insulating layer 149 may be further performed such that the height of the gap-fill insulating layer 149 is lower than that of the channel layer 147. Accordingly, the gap-fill insulating layer 149 is formed, which is surrounded by the channel layer 147 and has a height lower than that of the channel layer 147. A central region of the channel layer 147 exposed on the gap-fill insulating layer 149 may be filled with a capping pattern 151. The capping pattern 151 may be formed of a doped silicon layer including a second conductivity type dopant.

The multi-layered memory layer 145, the channel layer 147, and the gap-fill insulating layer 149, which are formed through the above-described processes, penetrate the first stack structure SS1 from the second stack structure SS2. The multi-layered memory layer 145, the channel layer 147, and the gap-fill insulating layer 149 may extend along the lower surface of the first stack structure SS1, the sidewall of the supporting body 111, and the top surface of the well doped structure 105 by penetrating the first stack structure SS1 from the second stack structure SS2.

FIGS. 9A to 9D show sectional views illustrating the operation ST17 indicated in FIG. 6.

Referring to FIG. 9A, the operation ST17 may include forming a first through part 153A by etching the second stack structure SS2 constituting the cell stack structure CST. The first through part 153A is a portion of the slit, and is formed using a difference in etching rate between the material layers constituting the second stack structure SS2 and the etch stop pattern 125ES. The first through part 153 overlaps with the etch stop pattern 125ES. The etch stop pattern 125ES serves as an etch stop layer in forming the first through part 153A.

The etch stop pattern 125ES is formed thick enough to serve as an etch stop layer. Thus, although a portion of the etch stop pattern 125ES is lost to an etching material for etching the second stack structure SS2, the etch stop pattern 125ES is not completely penetrated by the first through part 153A.

Referring to FIG. 9B, the operation ST17 may include forming a second through part 153B by etching the etch stop pattern 125ES. The second through part 153B is connected to the first through part 153A and is a portion of the slit. The second through part 153B exposes the first interlayer insulating layer 123 of the first stack structure SS1 constituting the cell stack structure CST. The etch stop pattern 125ES may be divided into a first pattern P1 and a second pattern P2 by the second through part 153B. While the second through part 153B is being formed, the material layers of the first stack structure SS1 may be used as etch stop layers, using a difference in etching rate between the material layers constituting the first stack structure SS1 and the etch stop pattern 125ES.

Figure 9C:
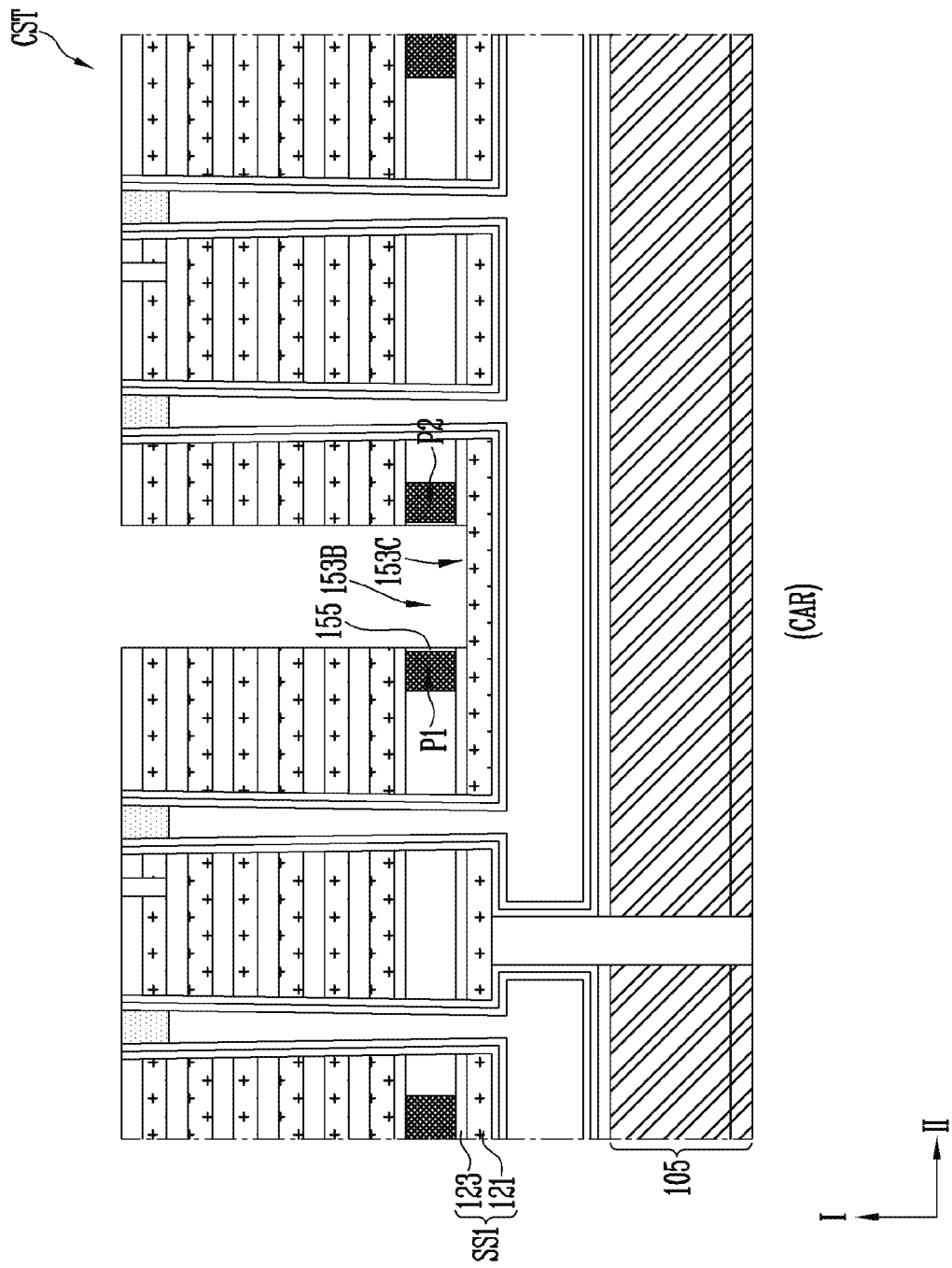

Referring to FIG. 9C, the operation ST17 may further include forming an oxidation region 155 by oxidizing a sidewall of each of the first pattern P1 and the second pattern P2, which are exposed by the second through part 153B.

The operation ST17 may include forming a third through part 153C by etching the first interlayer insulating layer 123 of the first stack structure SS1 constituting the cell stack structure CST. The third through part 153C is a portion of the slit. The third through part 153C is connected to the second through part 153B and exposes the first sacrificial layer 121 of the first stack structure SS1.

While the third through part 153C is being formed, the first sacrificial layer 121 may be used as an etch stop layer, using a difference in etching rate between the first interlayer insulating layer 123 and the first sacrificial layer 121 of the first stack structure SS1.

Referring to FIG. 9D, the operation ST17 may include a step of forming a fourth through part 153D by etching the first sacrificial layer 121 of the first stack structure SS1 constituting the cell stack structure CST. The fourth through part 153D is a portion of the slit. The fourth through part 153D is connected to the third through part 153C and exposes the multi-layered memory layer 145.

In FIGS. 9A to 9D, the first to fourth through parts 153A to 153D are connected to each other, extend in the third direction III described for FIG. 2A, and constitute a slit SI. According to an embodiment of the present disclosure, the etch stop pattern 125ES is disposed between the first stack structure SS1 and the second stack structure SS2. Accordingly, an etching process for forming the slit SI is divided into an etching operation using the etch stop pattern 125ES as an etch stop layer and etching operations using each of the material layers of the first stack structure SS1 as an etch stop layer, so that for an embodiment, the etching operations can be performed in succession. As a result, the depth of the slit SI can be precisely controlled through a simplified process.

Figure 10A:
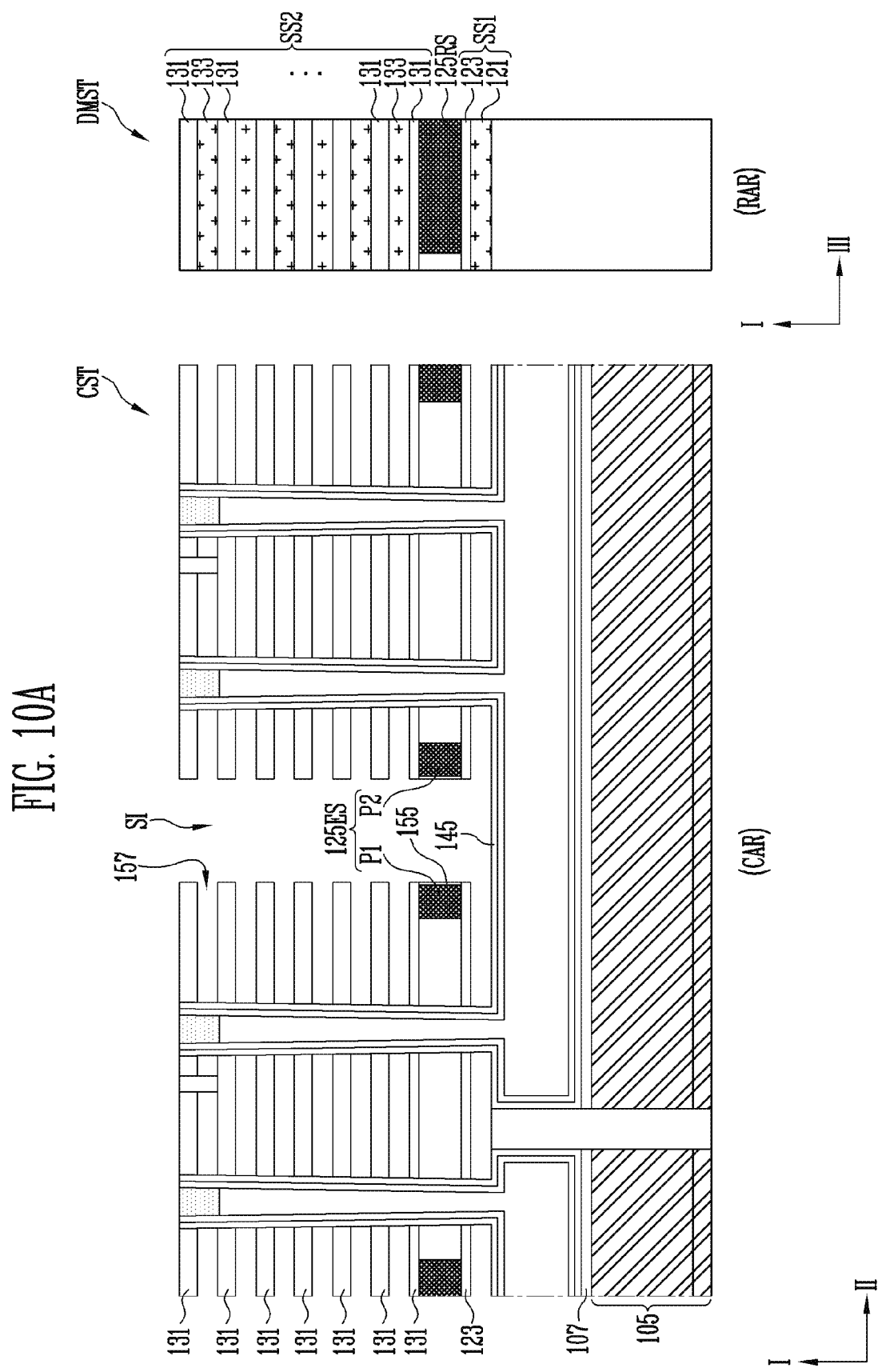
Figure 10B:
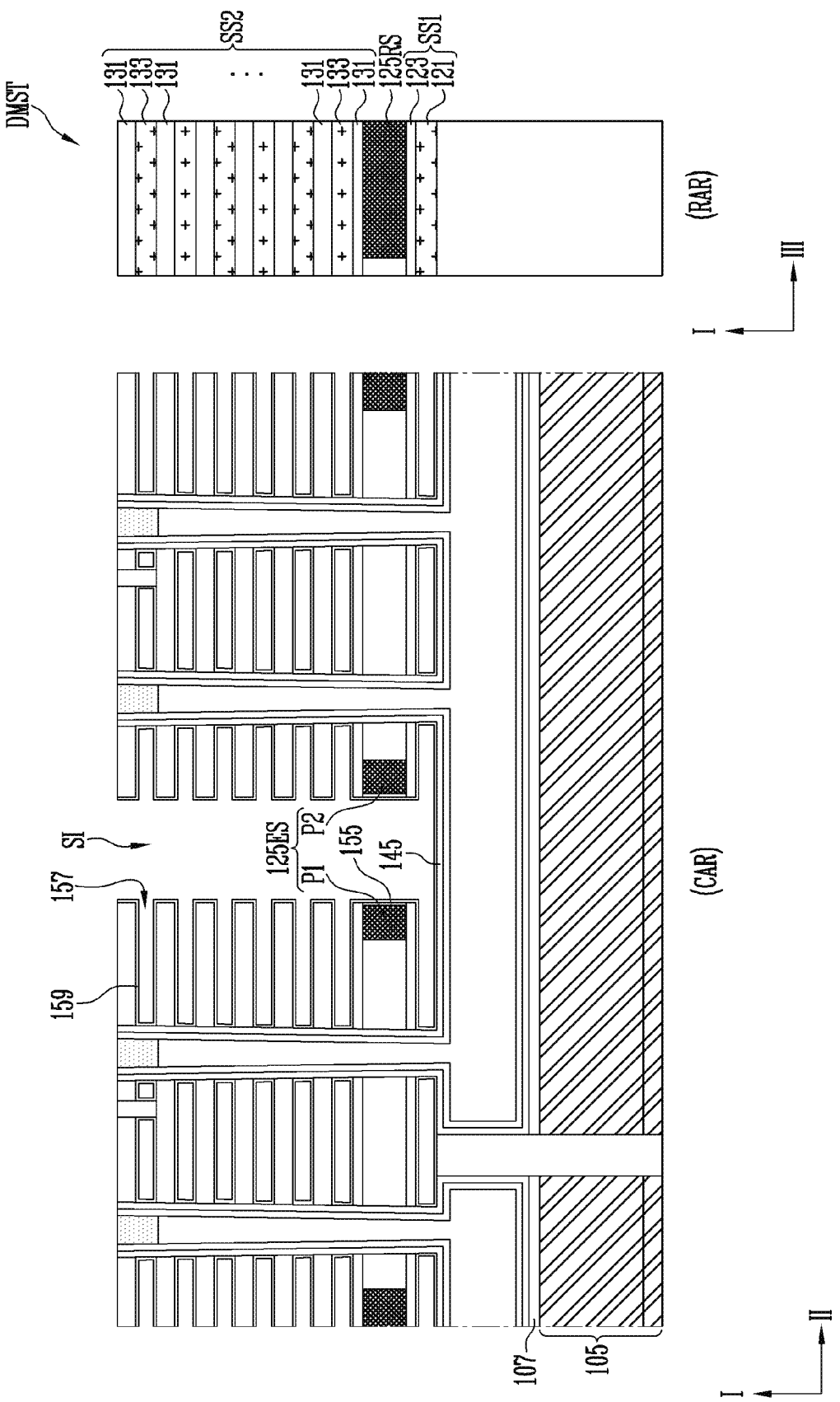

FIGS. 10A to 10C are sectional views illustrating the step ST19 shown in FIG. 6.

Referring to FIG. 10A, the operation ST19 may include opening gate regions 157 by removing the first and second sacrificial layers 121 and 133 through the slit SI. The gate regions 157 are defined by the regions in which the first and second sacrificial layers 121 and 133 of the cell stack structure CST are removed. The gate regions 157 may be defined between the multi-layered memory layer 145 and the first interlayer insulating layer 123, which are adjacent to each other in the first direction I, or between the second interlayer insulating layers 131 adjacent to each other in the first direction I.

Because the first and second sacrificial layers 121 and 133 of the dummy stack structure DMST in the resistive element region RAR are not exposed by the slit SI, the first and second sacrificial layers 121 and 133 of the dummy stack structure DMST are not removed and thus remain. That is, although the gate regions 157 in the cell array region CAR are opened through the slit SI, the first and second sacrificial layers 121 and 133 of the dummy stack structure DMST may remain in a state in which they overlap with the resistor pattern 125RS.

Referring to FIG. 10B, the operation ST19 may include forming a second blocking insulating layer 159 extending along surfaces of the gate regions 157 and a surface of the slit SI.

The second blocking insulating layer 159 may be formed of an insulating layer having a high dielectric constant. More specifically, the second blocking insulating layer 159 may include an aluminum oxide layer. The aluminum oxide layer may be deposited in an amorphous state and then crystallized through a heat treatment process.

Referring to FIG. 10C, the operation ST19 may include forming conductive patterns 161 filling in each of the gate regions 157 on the second blocking insulating layer 159. The conductive patterns 161 correspond to the gate electrodes CP1 and CP2 described with respect to FIGS. 2A and 5A.

Forming the conductive patterns 161 may include forming a second conductive layer through the slit SI to fill in the gate regions 157 and dividing the second conductive layer into a plurality of conductive patterns 161 by performing an etching process such that the second conductive layer in the slit SI is removed. The second conductive layer may include a low-resistance metal so as to form a low-resistance line. For example, the second conductive layer may be formed of a tungsten layer. Accordingly, a gate stack structure GST is formed, which includes the conductive patterns 161 in the cell array region CAR. The gate stack structure GST corresponds to the gate stack structures GST1 and GST2 shown in FIG. 2A.

For the operation ST19, while the gate stack structure GST is being formed and the first and second sacrificial layers of the cell stack structure are replaced with the conductive patterns 161, the first and second sacrificial layers 121 and 133 of the dummy stack structure DMST are not replaced with the conductive patterns 161 but instead remain.

FIG. 11A to 11F show sectional views illustrating the operations ST21 and ST23 indicated in FIG. 6.

Figure 11A:
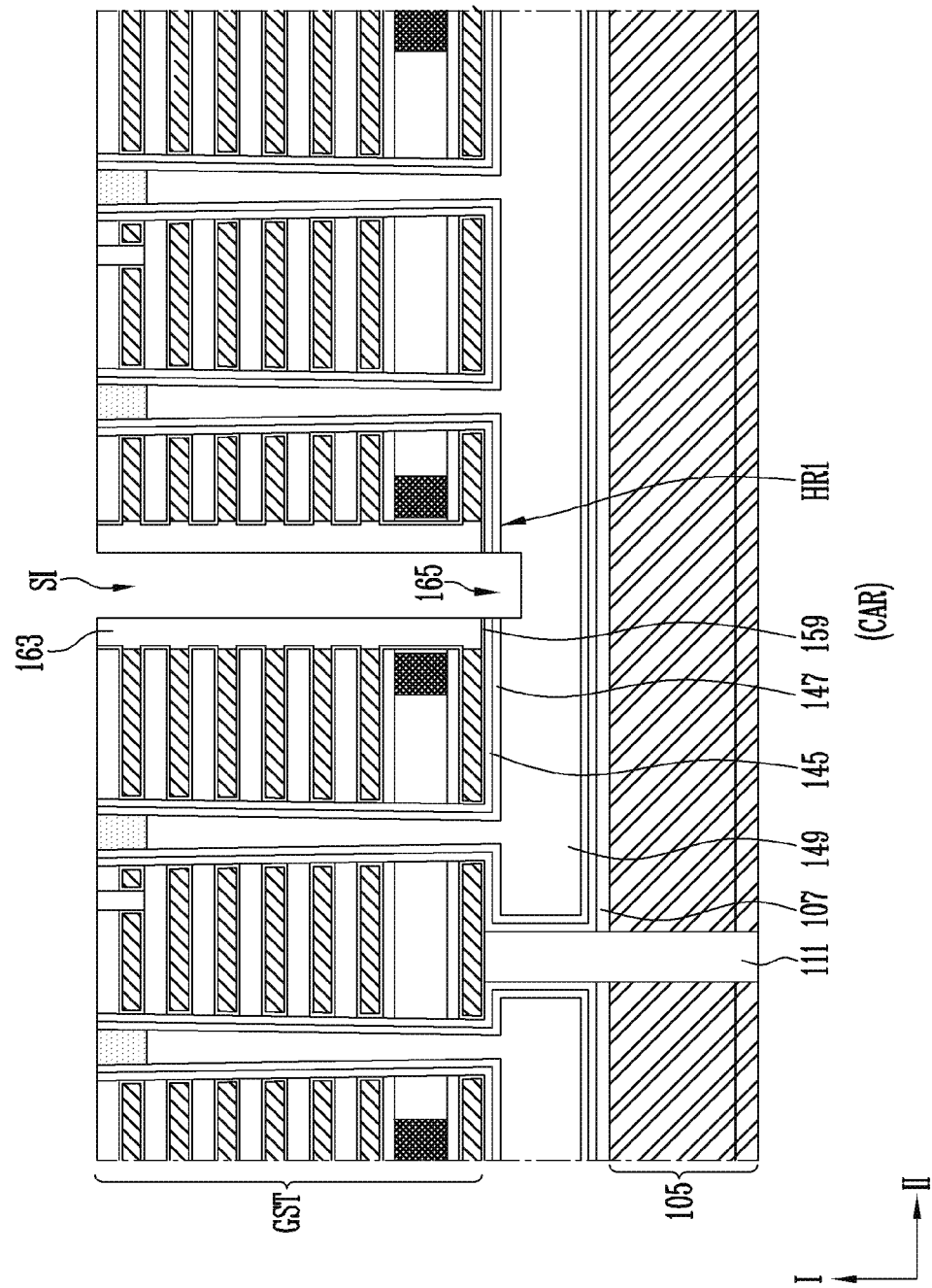

Referring to FIG. 11A, the operation ST21 may include forming a sidewall insulating layer 163 on a sidewall of the slit SI. Forming the sidewall insulating layer 163 may include depositing an insulating layer along the surface of the slit SI and a surface of the second blocking insulating layer 159 such that a central region of the slit SI is opened and etching the insulating layer through an etch-back process.

The operation ST21 may include forming a first cutting region 165 by etching the second blocking insulating layer 159, the multi-layered memory layer 145, and the channel layer 147, which are exposed by the sidewall insulating layer 163 through the central region of the slit SI. A first horizontal part HR1 of the channel layer 147 may be penetrated by the first cutting region 165. The first horizontal part HR1 of the channel layer 147 is a part that is disposed adjacent to the gate stack structure GST and extends in parallel to a bottom surface of the gate stack structure GST. The gap-fill insulating layer 149 is exposed by the first cutting region 165. The depth of the first cutting region 165 is controlled so as not to penetrate the gap-fill insulating layer 149. Like the slit SI, the first cutting region 165 extends along the third direction.

Figure 11B:
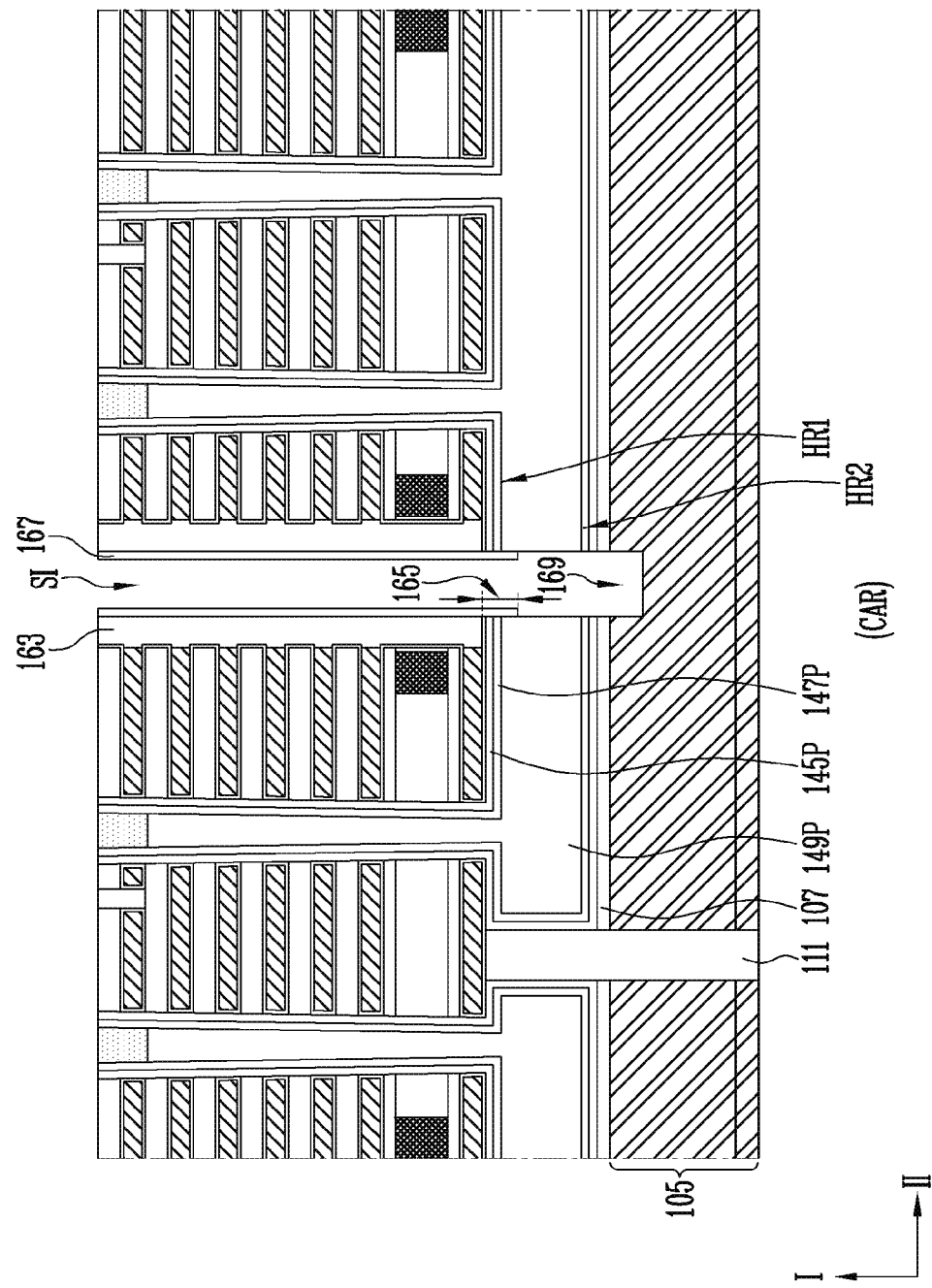

Referring to FIG. 11B, the operation ST21 may include forming a channel protective layer 167 on the sidewall insulating layer 163 to cover a sidewall of the first cutting region 165. The channel protective layer 167 extends on the sidewall insulating layer 161 and extends on the sidewall of the first cutting region 165. Forming the channel protective layer 167 may include depositing a nitride layer and etching the nitride layer through an etch-back process such that the gap-fill insulating layer 149 is exposed through the slit SI and the first cutting region 165. The channel protective layer 167 may be formed of a material layer having an etching rate different from that of an oxide layer, in addition to the nitride layer.

The operation ST21 may include forming a second cutting region 169 that exposes the well doped structure 105 by etching the gap-fill insulating layer, a second horizontal part HR2 of the channel layer, the multi-layered memory layer, and the protective layer 107, which overlap with the first cutting region 165. The second cutting region 169 is connected to the first cutting region 165. Like the slit SI, the second cutting region 169 extends along the third direction. The second horizontal part HR2 of the channel layer is a part that is disposed adjacent to the well doped structure 105 and extends in parallel to the top surface of the well doped structure 105. The second cutting region 169 may extend to the inside of the well doped structure 105.

By the first cutting region 165 and the second cutting region 169, the multi-layered memory layer may be divided into multi-layered memory patterns 145P, the channel layer may be divided into channel patterns 147P, and the gap-fill insulating layer may be divided into gap-fill insulating patterns 149P.

Referring to FIG. 11C, the operation ST21 may include forming a well-channel contact structure 171 that connects the well doped structure 105 to the second horizontal part HR2 of each of the channel patterns 147P.

The operation of forming the well-channel contact structure 171 may be performed through selective growth (e.g., selective poly growth (SPG)) using the well doped structure 105 and the second horizontal part HR2 of each of the channel patterns 147P as a seed layer.

The well-channel contact structure 171 may extend with the slit SI along the third direction. The well-channel contact structure 171 may be formed in the second cutting region. While the well-channel contact structure 171 is being grown, the first horizontal part HR1 of each of the channel patterns 147P is blocked by the channel protective layer 167, and hence the well-channel contact structure 171 is not grown from the first horizontal part HR1 of each of the channel patterns 147P. The first conductivity type dopant in the well doped structure 105 may be diffused into the well-channel contact structure 171.

Figure 11D:
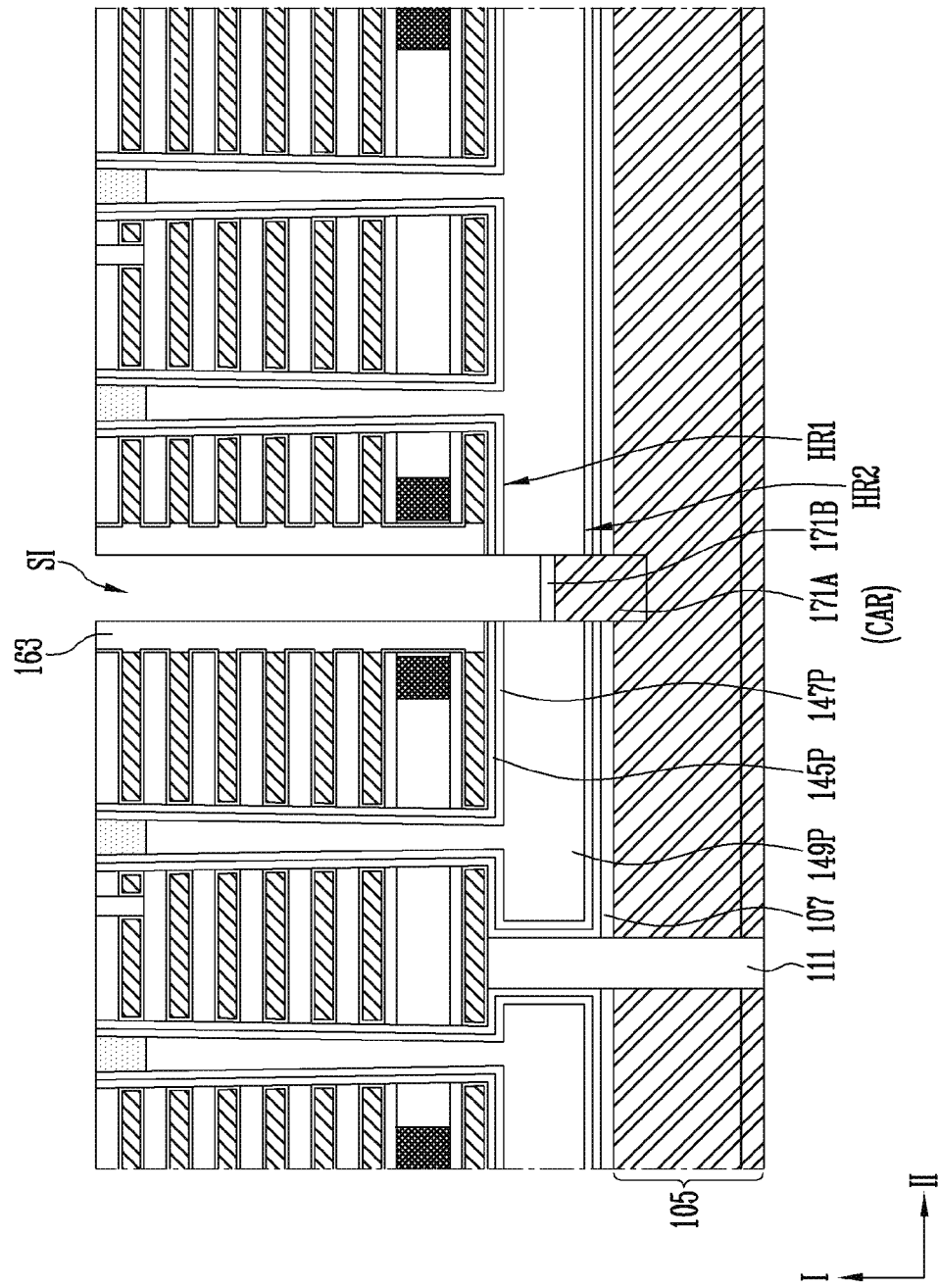

Referring to FIG. 11D, before the operation ST23 is performed, an inter-well-source insulating layer 171B may be formed by oxidizing an upper portion of the well-channel contact structure 171. A well-channel contact structure 171A under the inter-well-source insulating layer 171B is not oxidized but instead remains. The well-channel contact structure 171A connects the well doped structure 105 to the second horizontal part HR2 of the channel pattern 147P. The inter-well-source insulating layer 171B extends along the third direction to block the well-channel contact structure 171A.

Subsequently, the operation ST23 may include removing the channel protective layer 167 shown in FIG. 11C. The inter-well-source insulating layer 1718 has an etching rate different from that of the channel protective layer 167, and hence, the loss of the inter-well-source insulating layer 1718 can be minimized while the channel protective layer 167 is being removed. The sidewall insulating layer 163 is exposed as the channel protective layer 167 is removed. In addition, the first horizontal part HR1 of each of the channel patterns 147P is exposed as the channel protective layer 167 is removed.

Figure 11E:
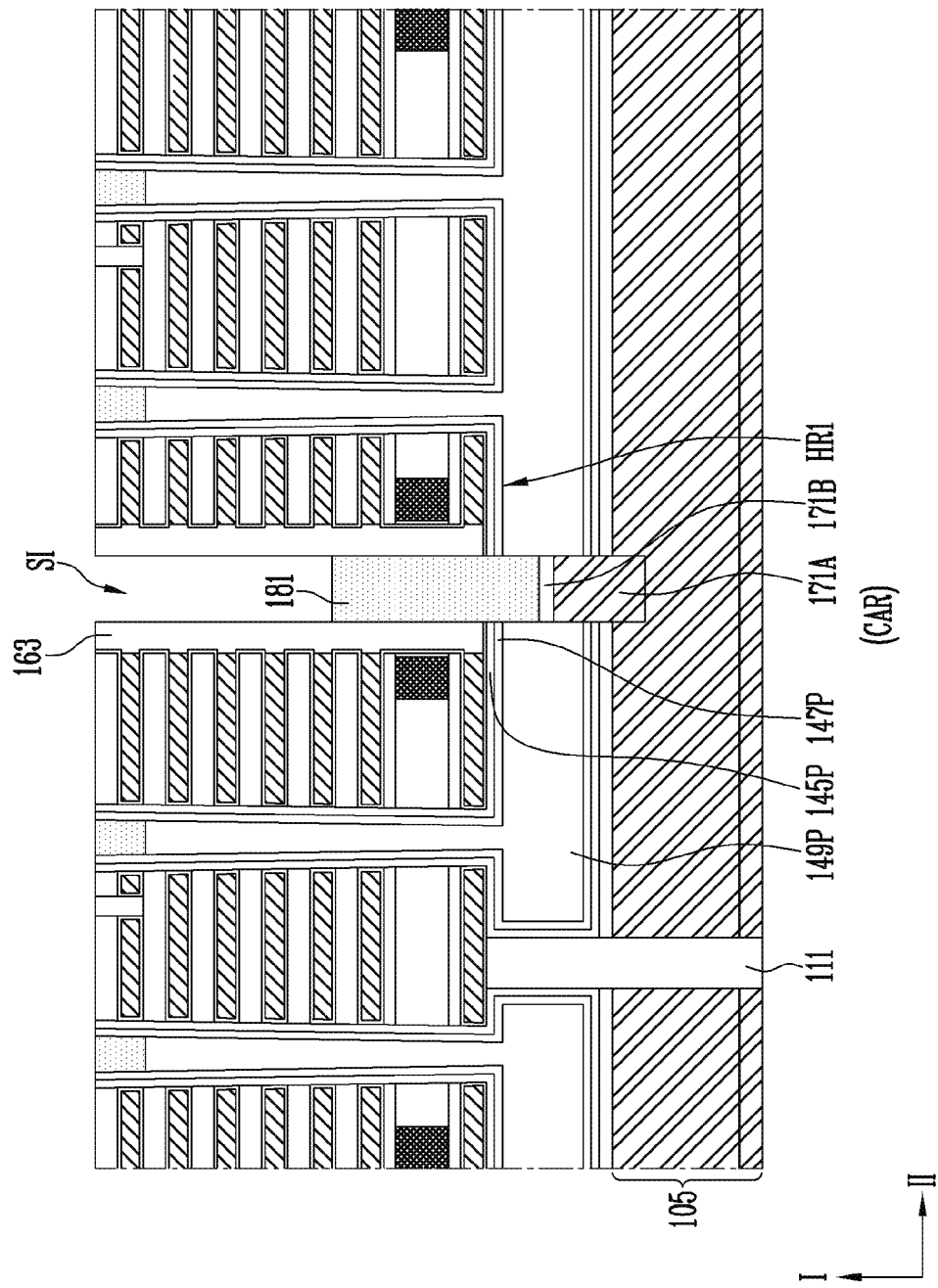

Referring to FIG. 11E, the operation ST23 may include forming a doped silicon layer 181 including a second conductivity type dopant on the inter-well-source insulating layer 1718. The doped silicon layer 181 is in direct contact with the first horizontal part HR1 of each of the channel patterns 147P and extends to the sidewall insulating layer 163. The doped silicon layer 181 may be formed to have a height lower than that of the slit SI.

The second conductivity type dopant may have a conductivity type opposite to that of the first conductivity type dopant in the well doped structure 105. For example, the second conductivity type dopant may be an n-type dopant, and the first conductivity type dopant may be a p-type dopant.

The doped silicon layer 181 may be structurally isolated from the well-channel contact structure 171A by the inter-well-source insulating layer 171B.

Referring to FIG. 11F for the operation ST23, a partial upper portion of the doped silicon layer may be silicided through a silicidation process to be changed into a metal silicide 181B. A doped silicon layer 181A under the metal silicide 181B is not silicided but may remain. The metal silicide 181B has a resistance lower than that of the doped silicon layer 181A, and hence, the resistance of a source contact line SCL can be lowered.

The silicidation process may include a process of depositing a metal layer and an annealing process of inducing a reaction between the metal layer and the doped silicon layer. The second conductivity type dopant in the doped silicon layer may be diffused into the first horizontal part HR1 of each of the channel patterns 147B through the annealing process for the silicidation process. Therefore, a source junction JN may be formed in each of the channel patterns 147P. The process of forming the source junction JN may be performed through a heat treatment process separate from the silicidation process, without using the annealing process for the silicidation process.

Various metal layers, such as nickel or tungsten, may be used as the metal layer for the silicidation process. The metal silicide 181B formed through the silicidation process may be nickel silicide, tungsten silicide, or the like.

The operation ST23 may further include forming a metal layer 185 on the metal silicide 181B. Before the metal layer 185 is formed, a barrier metal layer 183 may be further formed along surfaces of the sidewall insulating layer 163 and the metal silicide 181B.

The metal layer 185 may include tungsten, and the barrier metal layer 183 may include a titanium nitride layer, a tungsten nitride layer, a tantalum nitride layer, and the like.

Through the above-described processes, the source contact line SCL may be formed, which includes the doped silicon layer 181A, the metal silicide 181B, the barrier metal layer 183, and the metal layer 185. The source contact line SCL includes a second conductivity type dopant and is in contact with the first horizontal part HR1 of each of the channel patterns 147P above the well-channel contact structure 171A. The source contact line SCL and the well-channel contact structure 171A are spaced apart from each other by the inter-well-source insulating layer 171B. Accordingly, leakage current between the source junction JN and the well doped structure 105 can be reduced.

The semiconductor device shown in FIGS. 2B and 5B may be manufactured using the manufacturing processes described for FIGS. 7A to 7G, FIGS. 8A to 8D, FIGS. 9A to 9D, FIGS. 10A to 10C and FIGS. 11A to 11F. For some embodiments, however, unlike for FIG. 7E, the etch stop pattern may be patterned to entirely remain in the cell array region. Accordingly, unlike for FIG. 8A, the holes are formed to penetrate the etch stop pattern instead of the isolation insulating layer.

According to above-described embodiments of the present disclosure, the etch stop pattern is disposed between the gate electrodes so that it is possible to lower the level of difficulty of manufacturing processes for controlling the depth of the slit of the semiconductor device.

Figure 12:
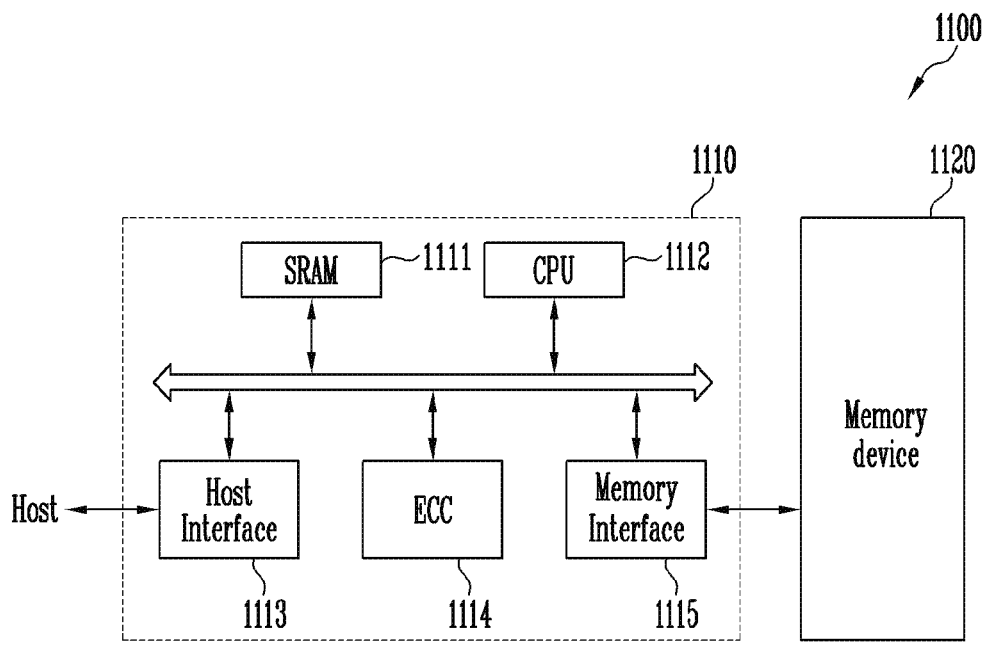
FIG. 12 shows a block diagram illustrating a configuration of a memory system according to an embodiment of the present disclosure.

FIG. 12 shows a block diagram illustrating a configuration of a memory system 1100 according to an embodiment of the present disclosure.

Referring to FIG. 12, the memory system 1100 includes a memory device 1120 and a memory controller 1110.

The memory device 1120 may include the structure described with reference to FIGS. 2A, 2B, 5A, and/or 5B. The memory device 1120 may be a multi-chip package configured with a plurality of flash memory chips.

The memory controller 1110 is configured to control the memory device 1120 and may include a static random access memory (SRAM) 1111, a central processing unit (CPU) 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 utilizes a data exchange protocol for a host connected with the memory system 1100. The ECC circuit 1114 detects and corrects errors included in data read from the memory device 1120, and the memory interface 1115 interfaces with the memory device 1120. In addition, the memory controller 1110 may further include ROM for storing code data for interfacing with the host and the like.

The memory system 1100 configured as described above may be a memory card or a solid state disk (SSD) in which the memory device 1120 is combined with the controller 1110. For example, when the memory system 1100 is an SSD, the memory controller 1100 may communicate with external devices (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, or an integrated drive electronics (IDE) protocol.

Figure 13:
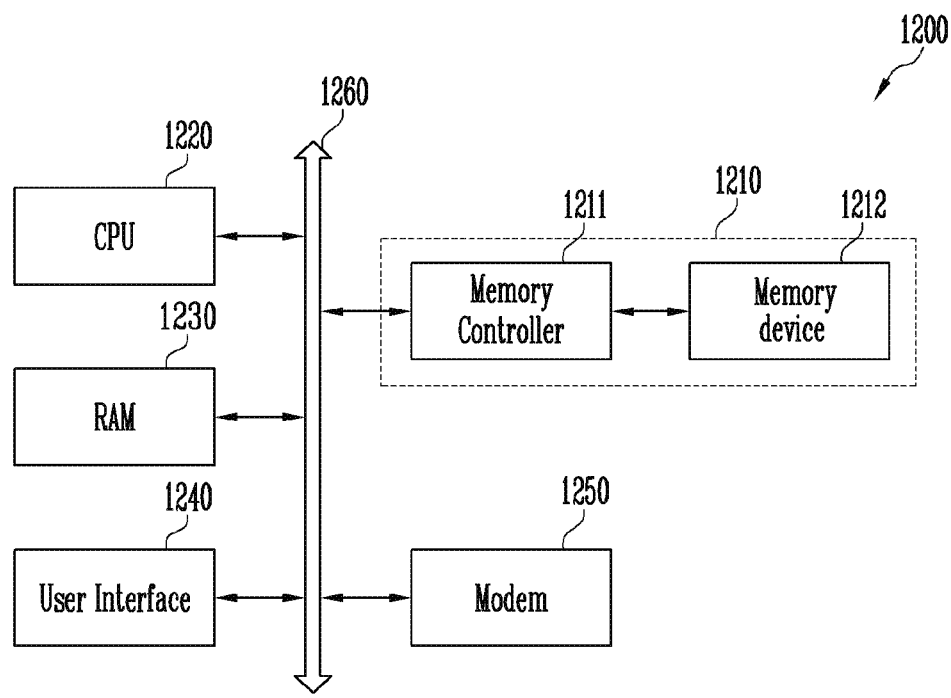
FIG. 13 shows a block diagram illustrating a configuration of a computing system according to an embodiment of the present disclosure.

FIG. 13 shows a block diagram illustrating a configuration of a computing system 1200 according to an embodiment of the present disclosure.

Referring to FIG. 13, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included. Additionally, an application chip set, a camera image processor (CIS), a mobile D-RAM, and the like may be further included.

The memory system 1210 includes a memory device 1212 and a memory controller 1211. For some embodiments, the memory device 1212 and the memory controller 1211 correspond to the memory device 1120 and the memory controller 1110, respectively, of FIG. 12.

Example embodiments have been disclosed herein, and although specific terms are employed, the terms are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A method of manufacturing a semiconductor device, the method comprising:
   forming a first stack structure in which a first sacrificial layer and a first interlayer insulating layer are stacked;
   forming an etch stop pattern on the first stack structure;
   forming a second stack structure on the etch stop pattern, wherein the second stack structure includes second interlayer insulating layers and second sacrificial layers alternately stacked;
   forming a channel layer penetrating the first stack structure from the second stack structure, wherein the channel layer extends along a lower surface of the first stack structure, and wherein the channel layer is surrounded by a multi-layered memory layer;
   forming a slit penetrating the first stack structure from the second stack structure; and
   replacing the first and second sacrificial layers with conductive patterns through the slit.

2. The method of claim 1, further comprising forming a lower structure prior to forming the first stack structure, wherein the lower structure comprises a first region, in which a well doped structure and a sacrificial structure are stacked, and a second region, in which a lower insulating layer is disposed, wherein the first stack structure and the second stack structure overlap the first region and the second region of the lower structure.

3. The method of claim 2, wherein the forming of the etch stop pattern comprises:
   forming, on the first stack structure, a first conductive layer overlapping the first region and the second region of the lower structure;
   etching the first conductive layer to form the etch stop pattern over the first region of the lower structure and a resistor pattern over the second region of the lower structure; and
   filling a region in which the first conductive layer is etched with an isolation insulating layer.

4. The method of claim 2, wherein the slit penetrates the first stack structure and the second stack structure formed over the first region of the lower structure, and wherein portions of the first and second sacrificial layers disposed over the second region of the lower structure are not replaced with the conductive patterns but instead remain to form a dummy stack structure.

5. The method of claim 2, wherein the forming of the channel layer surrounded by the multi-layered memory layer comprises:
   forming holes penetrating the first stack structure, the second stack structure, and the etch stop pattern disposed over the first region of the lower structure;
   opening a horizontal space between the first stack structure and the well doped structure by removing the sacrificial structure exposed through the holes;
   forming the multi-layered memory layer extending along surfaces of the holes and a surface of the horizontal space;
   forming the channel layer on a surface of the multi-layered memory layer; and
   forming a gap-fill insulating layer on the channel layer by filling the holes and the horizontal space.

6. The method of claim 2, further comprising:
   forming a first cutting region by removing an upper portion of the channel layer exposed through a central region of the slit;
   forming a channel protective layer on a sidewall insulating layer to cover the first cutting region;
   forming a second cutting region below the first cutting region, wherein the second cutting region penetrates a lower portion of the channel layer and exposes the well doped structure;
   forming a well-channel contact structure in the second cutting region, wherein the well-channel contact structure connects the channel layer to the well doped structure;
   forming an inter-well-source insulating layer on the well-channel contact structure;
   removing the channel protective layer; and
   forming a source contact line on the inter-well-source insulating layer, wherein the source contact line connects to the channel layer.

7. The method of claim 6, wherein the well doped structure comprises a first conductivity type dopant, and wherein the source contact line comprises a second conductivity type dopant opposite to the first conductivity type dopant.

8. The method of claim 7 further comprising diffusing the second conductivity type dopant into the channel layer.

9. A method of manufacturing a semiconductor device, the method comprising:
   forming a first stack structure in which a first sacrificial layer and a first interlayer insulating layer are stacked;
   forming an etch stop pattern on the first stack structure;
   forming a second stack structure on the etch stop pattern, wherein the second stack structure includes second interlayer insulating layers and second sacrificial layers alternately stacked;
   forming a channel layer penetrating the first stack structure from the second stack structure, wherein the channel layer extends along a lower surface of the first stack structure;
   forming a slit by etching through the second stack structure to the etch stop pattern to expose the second sacrificial layers;
   deepening the slit by etching through the etch stop pattern to the first interlayer insulating layer; and
   deepening the slit by etching through the first interlayer insulating layer to the first sacrificial layer.

10. The method of claim 9, further comprising:
deepening the slit by etching through the first sacrificial layer to a multi-layered memory layer, wherein the multi-layered memory layer surrounds the channel layer.

11. The method of claim 10 further comprising:
replacing the first and second sacrificial layers with conductive patterns through the slit.

* * * * *